United States Patent
Bazan et al.

(10) Patent No.: US 9,595,676 B2
(45) Date of Patent: Mar. 14, 2017

(54) SYNTHESIS OF WATER SOLUBLE DOPED CONJUGATED POLYELECTROLYTES FOR APPLICATIONS IN ORGANIC ELECTRONICS

(71) Applicant: THE REGENTS OF THE UNIVERSITY OF CALIFORNIA, Oakland, CA (US)

(72) Inventors: Guillermo C. Bazan, Santa Barbara, CA (US); Cheng-Kang Mai, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 90 days.

(21) Appl. No.: 14/470,629

(22) Filed: Aug. 27, 2014

(65) Prior Publication Data

US 2015/0075622 A1    Mar. 19, 2015

Related U.S. Application Data

(60) Provisional application No. 61/870,714, filed on Aug. 27, 2013.

(51) Int. Cl.
| | | |
|---|---|---|
| *C08G 75/00* | (2006.01) | |
| *H01L 51/00* | (2006.01) | |
| *H01L 51/42* | (2006.01) | |
| *H01G 9/20* | (2006.01) | |

(52) U.S. Cl.
CPC ...... *H01L 51/0043* (2013.01); *H01L 51/0036* (2013.01); *H01G 9/2013* (2013.01); *H01L 51/0003* (2013.01); *H01L 51/4253* (2013.01); *Y02E 10/549* (2013.01)

(58) Field of Classification Search
CPC ...... C08G 2261/124; C08G 2261/3243; C08G 2261/414; C08G 2261/91; H01L 51/0047; H01L 51/0036; H01L 51/0043; H01L 51/4253; Y02E 10/549
See application file for complete search history.

(56) References Cited

U.S. PATENT DOCUMENTS

| | | | | |
|---|---|---|---|---|
| 2006/0183140 A1* | 8/2006 | Bazan | ............... | C08G 61/02 435/6.11 |
| 2006/0204984 A1* | 9/2006 | Bazan | ............... | C08G 61/02 435/6.11 |
| 2006/0216734 A1* | 9/2006 | Bazan | ............... | C12Q 1/6818 435/6.11 |
| 2008/0015269 A1* | 1/2008 | Bazan | ............... | C09K 11/06 521/30 |

(Continued)

OTHER PUBLICATIONS

Zhou, H., et al., "Conductive Conjugated Polyelectrolyte as Hole-Transporting Layer for Organic Bulk Heterojunction Solar Cells," Advanced Materials, 2014, pp. 780-785, vol. 26.

(Continued)

*Primary Examiner* — Shane Fang
(74) *Attorney, Agent, or Firm* — Gates & Cooper LLP

(57) ABSTRACT

A method of fabricating a composition of matter, including fabricating one or more conjugated polyelectrolytes each comprising a donor-acceptor copolymer backbone and one or more anionic side groups, wherein the one or more conjugated polyelectrolytes are self doped. The doped conjugated polyelectrolytes can be used in a hole transport layer in a solar cell.

20 Claims, 23 Drawing Sheets

PCPDTBT-Pyr⁺Br⁻, R = Br;
PCPDTBT-Pyr⁺BIm₄⁻, R = BIm₄

(56) References Cited

U.S. PATENT DOCUMENTS

2009/0230362 A1* 9/2009 Bazan .................. C07D 233/56
252/512

OTHER PUBLICATIONS

Mai, C-K, et al., "Facile Doping of Anionic Narrow-Band-Gap Conjugated Polyelectrolytes During Dialysis," Angew. Chem. Int. Ed., 2013, pp. 12874-12878, vol. 52.

Freund, M.S., et al., "Self-Doped Conducting Polymers", John Wiley & Sons Ltd, 2007, England.

http://www.heraeusclevios.com/media/webmedia_local/media/datenblaetter/81075812_CLEVIOS_P_VP_AI_4083 20101222.pdf, 2014.

Dang, X-D., et al., "Morphology and conductivity modification of poly(3,4-ethylenedioxythiophene):poly(styrene sulfonate) films induced by conductive atomic force microscopy measurements", Applied Physics Letters, 2008, pp. 241911-1-214911-3, vol. 93.

Zhou, H. et al., "High-Efficiency Polymer Solar Cells Enhanced by Solvent Treatment", Adv. Mater., 2013, pp. 1646-1652, vol. 25.

Tang, Z., et al., "Interlayer for Modified Cathode in Highly Efficient Inverted ITO-Free Organic Solar Cells", Adv. Mater., 2012, pp. 554-558, vol. 24.

Li, C-Y. et al., "Sulfonated poly(diphenylamine) as a novel hole-collecting layer in polymer photovoltaic cells", J. Mater. Chem., 2008, pp. 4478-4482, vol. 18.

Garcia, A., et al., "Improvement of Interfacial Contacts for New Small-Molecule Bulk-Heterojunction Organic Photovoltaics", Adv. Mater., 2012, pp. 5368-5373, vol. 24.

Irwin, M.D., et al., "p-Type semiconducting nickel oxide as an efficiency-enhancing anode interfacial layer in polymer bulk-heterojunction solar cells", PNAS, Feb. 26, 2008, pp. 2783-2787, vol. 105, No. 8.

Yoo, J.E., et al., "Directly patternable, highly conducting polymers for broad applications in organic electronics", PNAS, Mar. 30, 2010, pp. 5712-5717, vol. 107, No. 13.

Ikenoue, Y., et al., "A Facile Preparation of a Self-doped Conducting Polymer", J. Chem. Soc. Chem. Commun., 1990, pp. 1694-1695.

Ikenoue, Y., et al., "Electrochemical Studies of Self.Doped Conducting Polymers: Verification of the 'Cation-Popping' Doping Mechanism", Synthetic Metals, 1989, pp. 305-319, vol. 30.

Patil, A.O., et al., "Water-Soluble Conducting Polymers", J. Am. Chem. Soc., 1987, pp. 1858-1859, vol. 109.

Patil, A.O., et al., "Self-Doped Conducting Polymers", Synthetic Metals, 1987, pp. 151-159, vol. 20.

Zotti, G., et al., "Doping-Induced Ion-Exchange in the Highly Conjugated Self-Doped Polythiophene from Anodic coupling of 4-(4H-Cyclopentadithien-4-yl)butanesulfonate", Chem. Mater, 1997, pp. 2940-2944, vol. 9.

Huang, F., et al., "Synthesis and properties of a novel water-soluble anionic polyfluorenes for highly sensitive biosensors", Polymer 46, 2005, pp. 12010-12015.

Henson, Z.B., et al., "Synthesis and Properties of Two Cationic Narrow Band Gap Conjugated Polyelectrolytes", J. Am. Chem. Soc., 2013, pp. 4163-4166, vol. 135.

Yip, H-L., et al., "Recent advances in solution-processed interfacial materials for efficient and stable polymer solar cells", Energy & Environmental Science, 2012, pp. 5994-6011, vol. 5.

Han, C.C., et al., "Protonic Acids: Generally Applicable Dopants for Conducting Polymers", Synthetic Metals, 1989, pp. 123-131, vol. 30.

Yu, G., et al., "Polymer Photovoltaic Cells: Enhanced Efficiencies via a Network of Internal Donor-Accepted Heterojunctions", Science, Dec. 15, 1995, pp. 1789-1791, vol. 270.

Peet, J., et al., "Efficiency enhancement in low-bandgap polymer solar cells by processing with alkane dithiols", Nature Materials, Jul. 2007, pp. 497-500, vol. 6.

* cited by examiner

| Source S | Active Layer 2004 | Drain D |
|---|---|---|
| Dielectric Layer | Gate G | 2002 |
| Substrate (e.g. Si) 2000 |||

Figure 20

| Metal Contact 2110 |
|---|
| N- type interface/transport layer 2108 |
| Active layer 2106 |
| P- type interface/transport layer 2104 |
| Transparent Conductive Layer 2102 |
| Substrate 2100 |

SYNTHESIS OF WATER SOLUBLE DOPED CONJUGATED POLYELECTROLYTES FOR APPLICATIONS IN ORGANIC ELECTRONICS

CROSS REFERENCE TO RELATED APPLICATIONS

This application claims the benefit under 35 U.S.C. Section 119(e) of U.S. Provisional Patent Application Ser. No. 61/870,714 filed on Aug. 27, 2013, by Guillermo C. Bazan and Cheng-Kang Mai, entitled "SYNTHESIS OF WATER SOLUBLE DOPED CONJUGATED POLYELECTROLYTES FOR APPLICATIONS IN ORGANIC ELECTRONICS," which application is incorporated by reference herein.

STATEMENT REGARDING FEDERALLY SPONSORED RESEARCH AND DEVELOPMENT

This invention was made with Government support under Grant No. MURI FA 9550-12-0002, Control of Thermal and Electrical Transport in Organic and Composite Materials Through Molecular and Nanoscale Structure, awarded by AFOSR. The Government has certain rights in this invention.

BACKGROUND OF THE INVENTION

1. Field of the Invention

The present invention relates to a method of fabricating doped conjugated polyelectrolytes and their implementation in organic electronic or optoelectronic devices.

2. Description of the Related Art (Note: This application references a number of different publications as indicated throughout the specification by one or more reference numbers/numerals within brackets, e.g., [x]. A list of these different publications ordered according to these reference numbers/numerals can be found below in the section entitled "References." Each of these publications is incorporated by reference herein.)

Conjugated polyelectrolytes (CPEs) are defined by a backbone that contains a π-conjugated electronic structure with pendant ionic functionalities [1-2]. They are fascinating objects of study, as they combine the optical and charge transport properties of organic semiconductors with the possibility of modulating physical properties via electrostatic interactions. Water-soluble CPEs have found utility as optical reporters in biosensors and bio-imaging applications [3-8]. Furthermore, due to their solubility in polar solvents, it is possible to fabricate multilayer optoelectronic devices in combination with neutral conjugated polymers. CPE interlayers have thus proven useful in organic solar cells [9-12], organic light-emitting diodes [13-14], and organic thin film transistors (OTFTs) [15-16].

Cationic narrow bandgap conjugated polyelectrolytes with a backbone containing alternating 4,4-bis-alkyl-4H-cyclopenta-[2,1-b;3,4-b']-dithiophene and 2,1,3-benzothiadiazole structural units, see FIG. 1(a), were recently reported [17]. For the specific case of PCPDTBT-Pyr$^+$ BIm$_4^-$, one observes unexpected n-type transport in film field-effect transistors. It was proposed that the pendant cationic functionalities lower both the energies of the highest occupied molecular orbital (HOMO) and the lowest unoccupied molecular orbital (LUMO), thus stabilizing the radical anions in the conjugated backbones.

Bulk heterojunction (BHJ) solar cells comprising conjugated polymer donor and fullerene acceptor offer promising advantages such as low cost, light weight, and flexibility [43-45]. In addition to new materials design [46-49] and morphology optimization [50-51], interface engineering on BHJ solar cells is fundamentally important to enhance the power conversion efficiency (PCE) and device stability [52-53]. To improve the charge selectivity at the electrodes and minimize the energy barrier for charge extraction, a hole-transporting layer (HTL) with electron-blocking properties is inserted between the anode and BHJ active layer, and an electron-transporting layer (ETL) with hole-blocking properties is inserted between the cathode and BHJ active layer. The highly doped polymer Poly(3,4-ethylenedioxythiophene) Polystyrene sulfonate (PEDOT:PSS) is the most commonly used HTL material for organic BHJ solar cells, because of its solution processability, work function, sufficient conductivity, and high optical transparency in the visible-near infra-red (NIR) regime [52]. However, the strong anisotropy in the electrical conduction in spin-coated PEDOT:PSS layers, originating from their lamellar structures, often limits the charge collection in solar cells [54-57]. In addition, the acidic and hygroscopic nature of PEDOT:PSS tends to induce chemical instability between the active layer and electrodes [58-59]. To overcome these deficiencies, several types of materials have been explored to serve as HTLs in BHJ solar cells, including conducting polymers [60], metal oxides [49, 61-62], conjugated polyelectrolytes (CPEs) [63], cross-linkable materials [64], and graphene-based materials [65].

CPEs used as an interfacial material for organic photovoltaics have received increasing attention with the proven ability of improving the PCE through solution processing [63, 66-70]. In the past, conjugated polyelectrolyte (CPE) layers have been utilized as ETLs to improve electron extraction toward the cathode [66-70]. The advantages of CPEs as ETLs in BHJ solar cells include reduction of the series resistance, increase of the internal built-in voltage, and modification of the electron extraction properties. As a result, the short-circuit current ($J_{sc}$), open-circuit voltage ($V_{oc}$), and fill factor (FF) can be selectively [66, 69, 70], or even simultaneously enhanced on a single device [67]. More recently, CPE interlayers have been also applied on the bottom cathode in inverted cells, leading to a record PCE approaching 10% based on BHJ solar cells using a single layer structure [70]. In contrast, the function of CPEs in affecting the hole injection/extraction has been rarely addressed [63]. One reason is that direct depositing CPE on top of the ITO substrate can often result in a decrease in the electrode's work function due to interfacial dipole interactions [71], resulting in hole extraction barrier. Another limitation is that most of the CPEs show relatively low electrical conductivity.

SUMMARY OF THE INVENTION

One or more embodiments of the present invention disclose a method of fabricating a composition of matter, comprising fabricating one or more CPEs each comprising a donor-acceptor copolymer backbone and one or more anionic side groups, wherein the one or more conjugated polyelectrolytes are self doped.

The method can comprise obtaining a composition of matter comprising one or more CPEs in a solvent (e.g., water or a protic solvent), each of the CPEs having a donor-acceptor copolymer backbone (e.g., CPDT) and one or more anionic side groups (e.g., sulfonate anionic side groups); and subjecting the composition of matter to dialysis (e.g., via a dialysis membrane having a molecular weight cut off of 3500-5000 Daltons (Da)), wherein the CPEs are p-type doped after the dialysis.

The self doped CPEs can be pH neutral.

The fabricating can include p-type doping the CPEs. The doping can include immersing the conjugated polyelectrolyte in a solvent comprising water. The doping can comprise protonating the conjugated polyelectrolytes (protonating the copolymer backbone).

The synthesis conditions can allow formation of cationic polarons on the copolymer backbone wherein the anionic groups increase stability of the cationic polarons by coulombic stabilization.

In one or more embodiments, the doping provides a film, deposited from a solution comprising the CPEs having a hole or p-type electrical conductivity of at least $\sigma=1.5\times10^{-3}$ Siemens per centimeter (S/cm), at least $\sigma=2\times10^{-4}$ S/cm, or in a range of $\sigma=1.5\times10^{-3}$–0.2 S/cm.

One or more embodiments of the copolymer can have selected bandgaps and ionization potentials, for example, a bandgap of no more than 2.14 electron volts (eV) and an ionization potential of no more than 4.92 eV, a bandgap of less than 2.44 eV and an ionization potential of less than 5.38 eV, or a bandgap of no more than 2.29 eV and an ionization potential of no more than 5.15 eV. The copolymer can comprise an electron-rich heterocycle which provides the copolymer with the low ionization potential.

One or more embodiments of the invention disclose counterparts of PCPDTBT-Pyr$^+$BIm$_4^-$ with anionic charges provided by pendant sulfonated functionalities. These materials, shown in FIG. 1(b), display a propensity to form cationic polarons by the simple action of dialysis thereby yielding self-doped polymers [18]. Comparison against structurally related CPEs allows the present invention to delineate structural features that facilitate this change in electronic properties.

For example, the CPEs can be PCPDTBTSO$_3$—C with a poly[2,6-(4,4-bis-Cbutanylsulfonate-4H-cyclopenta-[2,1-b; 3,4-b']-dithiophene)-alt-4,7-(2,1,3-benzothiadiazole)] donor-acceptor backbone, where C is a counterion or countercation (e.g., Potassium (K), tetrabutylammonium (TBA), or sodium (Na)) such that the doped CPE is soluble in a pH neutral solvent used during solution processing in a device.

For example, the present invention discloses an anionic, narrow bandgap conjugated polyelectrolyte PCPDTBTSO$_3$K with a poly[2,6-(4,4-bis-butanylsulfonate-4H-cyclopenta-[2,1-b;3,4-b']-dithiophene)-alt-4,7-(2,1,3-benzothiadiazole)] donor acceptor backbone, synthesized via the Suzuki polymerization and found to be self doped via dialysis in water during the process of purification.

One or more embodiments of the invention incorporate the doped CPEs in an organic electronic device such as a solar cell. In one or more embodiments, the doped CPEs can be incorporated in/as a hole transport layer (HTL) or anode buffer layer in the organic optoelectronic or electronic device.

For example, one or more embodiments of the invention further comprise fabricating the doped CPE as an HTL in a solar cell, wherein the fabricating comprises solution processing and casting the doped CPEs, or a film comprising the doped CPEs, on a substrate; coating the doped CPE with a bulk heterojunction polymer active region; treating the active region; and depositing a cathode on the active region, wherein the film comprising the doped CPEs has a thickness and homogenous conductivity such that the solar cell has a power conversion efficiency (PCE) of at least 6.2%, a short circuit current density $J_{sc}$ of at least 13.5 milliamps per centimeter square (mA/cm$^{-2}$), an open circuit voltage $V_{oc}$ of no less than 0.69 V, and a Fill Factor FF of at least 0.66, under AM 1.5 G irradiation. At wavelengths between 350 nanometers (nm) and 700 nm, an incident photon conversion efficiency (IPCE) of the solar cell device (comprising the CPE HTL) can be over 70% with a solar cell $J_{sc}$ of at least 16.32 mA/cm$^{-2}$.

In one or more embodiments, the HTL comprising the doped CPEs can have a root mean square (RMS) surface roughness of no more than 0.74 nm over an area of at least 5 micrometers by 5 micrometers.

One or more embodiments of the invention further disclose a composition of matter, comprising a self-doped conjugated polyelectrolyte comprising a donor-acceptor copolymer backbone and one or more anionic side groups.

BRIEF DESCRIPTION OF THE DRAWINGS

Referring now to the drawings in which like reference numbers represent corresponding parts throughout:

FIG. 20 is a cross sectional schematic of a transistor or electronic device having an active region including the CPE.

FIG. 21 is a cross sectional schematic of a light emitting diode having the n-type or p-type interface transport layer comprising the CPE.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Fabrication of a Doped CPE

Figure 1A:
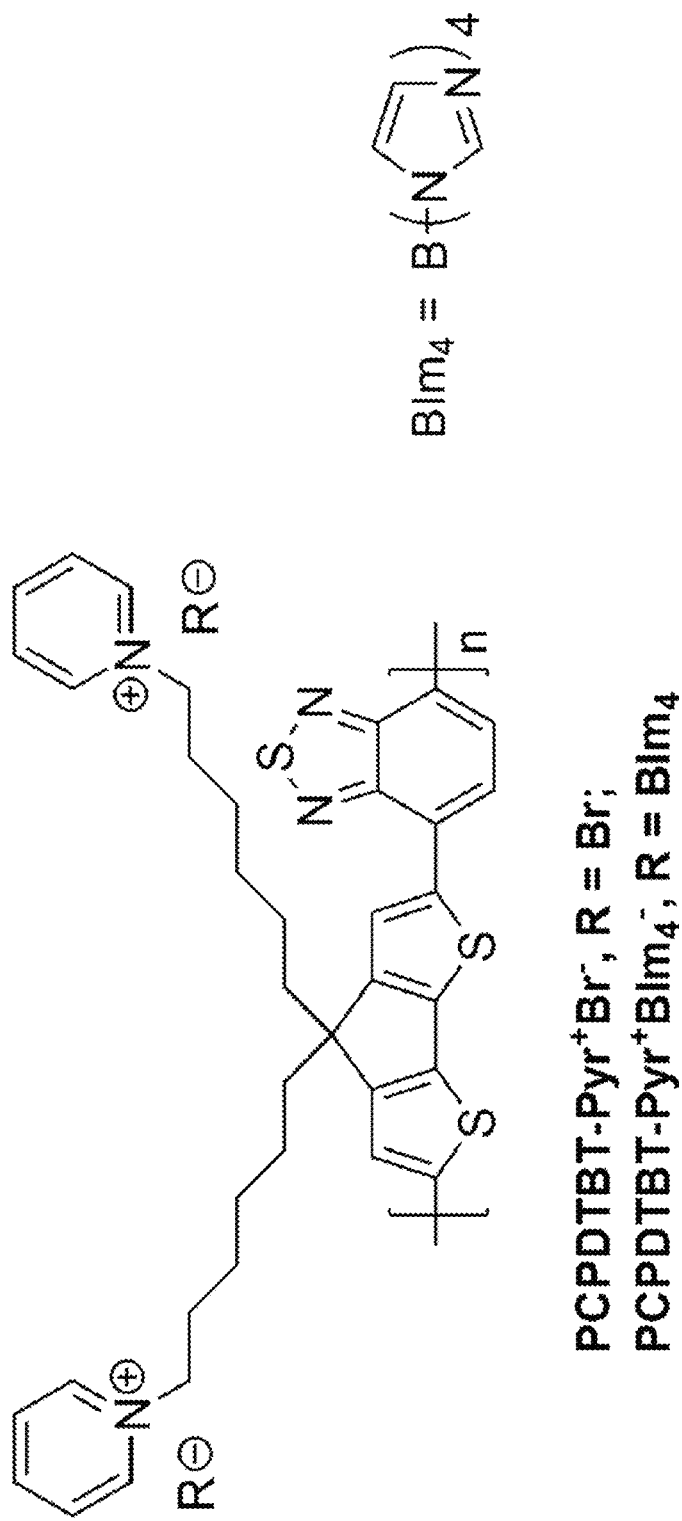
FIG. 1(a) shows structures of Cationic Narrow Band Gap CPEs, PCPDTBT-Pyr$^+$Br$^-$ and PCPDTBT-Pyr$^+$BIm$_4^-$.
Figure 1B:
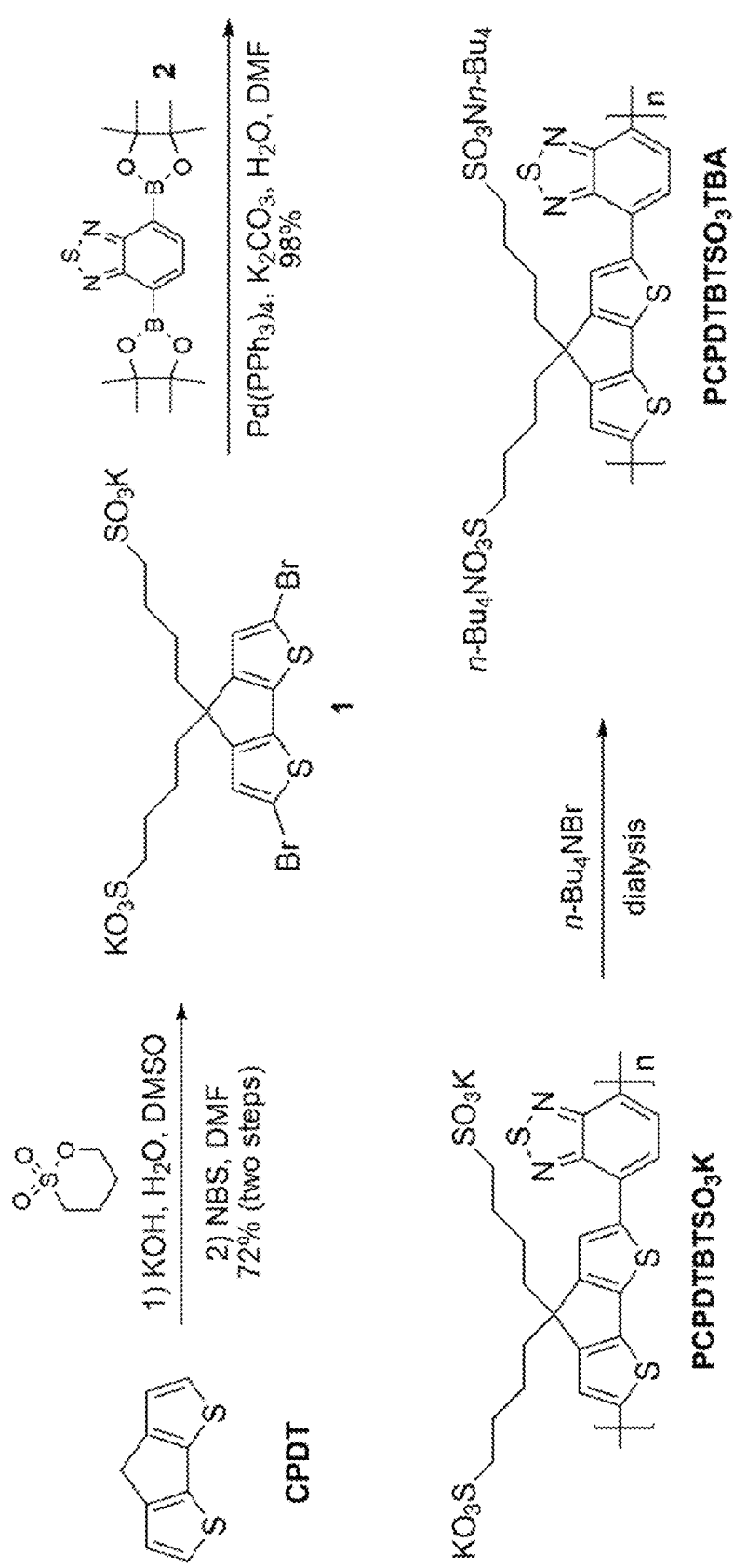
FIG. 1(b) shows synthesis of narrow band gap conjugated polyelectrolyte PCPDTBTSO$_3$K, and the conversion to PCPDTBTSO$_3$TBA.

The preparation of PCPDTBTSO$_3$K is shown in FIG. 1(b). Alkylation of commercially available cyclopentadithiophene (CPDT) with 1,4-butanesultone under basic conditions, followed by bromination using N-bromosuccinimide (NBS), provides water-soluble monomer 1. Suzuki coupling of 1 and commercially available bispinacolate 2 in a Dimethylformamide/water (DMF/H$_2$O) solvent mixture affords the target PCPDTBTSO$_3$K [19]. For purification, PCPDTBTSO$_3$K was precipitated in acetone, filtered, washed with copious amounts of acetone and methanol, and subjected to dialysis in water for three days. The molecular weight cut off of the dialysis membrane is 3500-5000 Da. After drying under vacuum, one obtains the product as a dark blue solid. The ionic nature of PCPDTBTSO$_3$K renders it soluble in water and insoluble in polar organic solvents, such as CH$_3$CN, MeOH, DMF, and DMSO.

Exchange of the countercations in PCPDTBTSO$_3$K was carried out with excess tetrabutylammonium bromide (TBABr) with the aim of improving solubility and facilitating characterization [20]. Purification by dialysis in water provided a new CPE, namely PCPDTBTSO$_3$TBA, in which the original potassium countercations are replaced with more solubilizing tetrabutylammonium counterparts [21]. As a result, one can dissolve PCDTBTSO$_3$TBA in MeOH, DMF, and DMSO, and thereby enable determination of molecular weight by gel permeation chromatography in DMF. The number average molecular weight was determined to be about ~8 kg/mol. The low molecular weight likely arises due to precipitation of PCPDTBTSO$_3$K during the polymerization reaction.

Figure 2A:
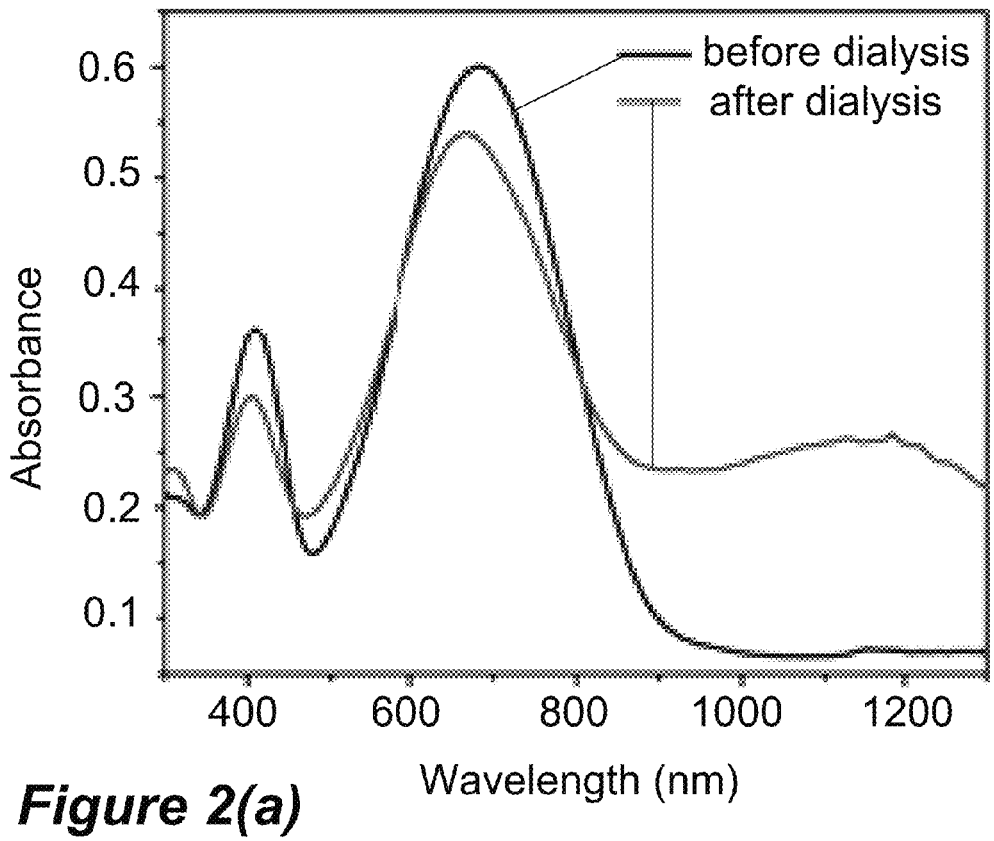
FIG. 2(a) shows Ultraviolet (UV)-Visible (Vis)-NIR absorption spectra of PCPDTBTSO$_3$K in water (0.025 milligrams per milliliter (mg/mL)), before dialysis (black) and after dialysis (red)
Figure 2B:
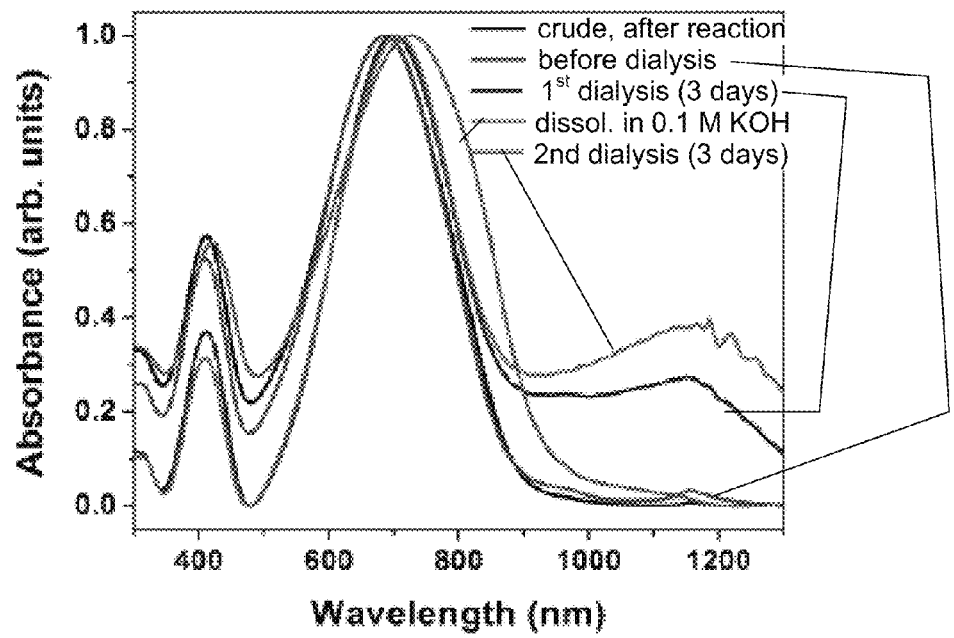
FIG. 2(b) shows UV-Vis-NIR absorption spectra of PCPDTBTSO3K at different stages of processing: crude (black), after precipitation and filtration (red), after first (1$^{st}$) dialysis in water for three days (blue), dissolution (dissol.) in 0.1 M potassium hydroxide (KOH) aqueous solution (cyan), and after second (2$^{nd}$) dialysis in water again for three days (magenta).

The solution (1:1 H$_2$O:MeOH) UV-Vis-NIR absorption spectra of PCPDTBTSO$_3$K samples obtained before and after dialysis are provided in FIGS. 2(a)-(b). The spectrum of PCPDTBTSO$_3$K after dialysis exhibits three major transitions. Two peaks, centered at 410 nm and 670 nm, are within the usual range of these donor-acceptor (D-A) copolymers and are characteristic for polymers with π-conjugated backbones containing cyclopenta-[2,1-b;3,4-b']-dithiophene-alt-4,7-(2,1,3-benzothiadiazole) [22-23]. Surprisingly, one also observes a broad, low energy transition that begins at about 900 nm and extends beyond 1300 nm. The energy range of this transition is reminiscent of those characteristic of polarons [24]. Since the spectra of PCPDTBTSO$_3$K before dialysis does not show this low energy band, we surmised that polaronic structures were generated during dialysis.

Figure 3:
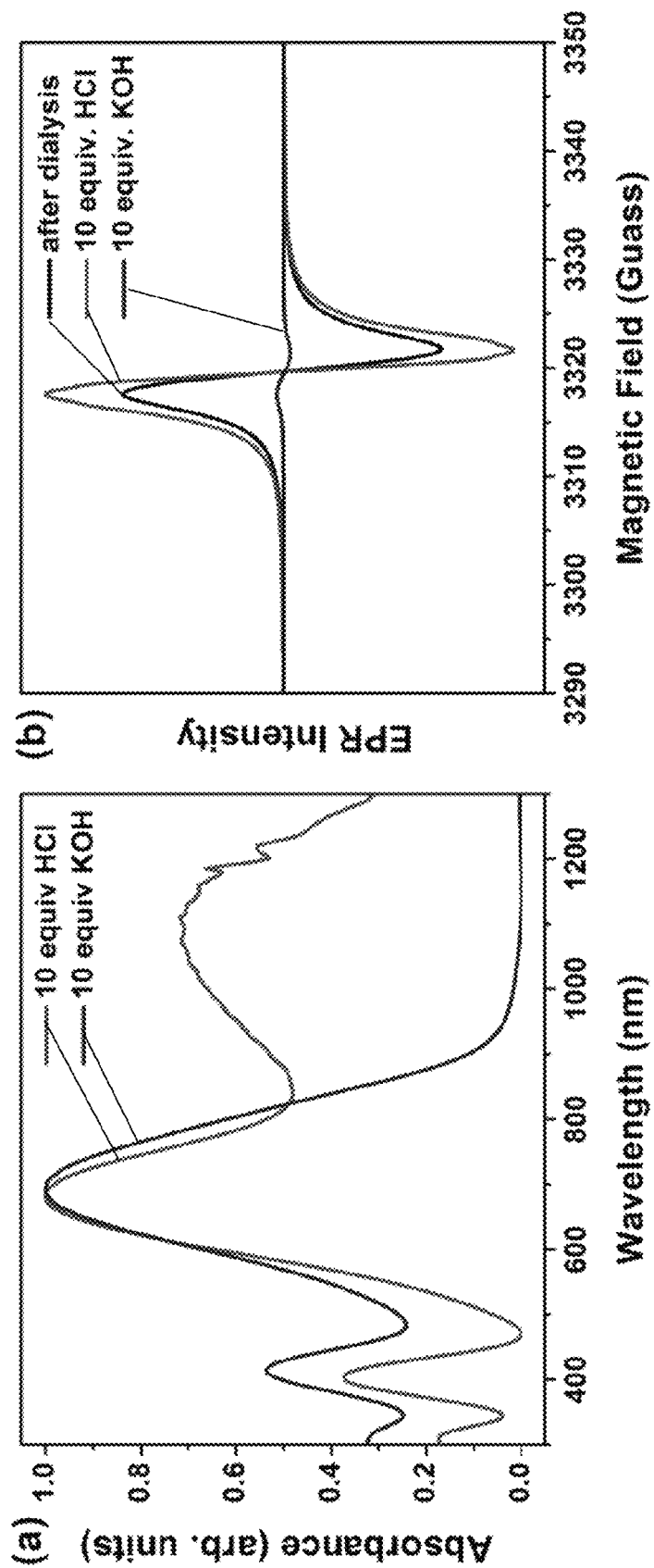
FIG. 3 shows a) UV-Vis-NIR absorption spectra of PCPDTBTSO$_3$K in solution (1:1 H$_2$O:MeOH) with 10 equiv. Hydrochloric acid (HCl) added (red) and with 10 equiv. KOH added (blue); and b) electron paramagnetic resonance (EPR) signals: after dialysis (black), with 10 equiv. HCl (red), and with 10 equiv. KOH (blue).

The possible presence of polarons as indicated by the absorption in FIGS. 2(a)-(b) prompted us to investigate possible doping mechanisms. It was first determined that the contribution of the low energy band to the total optical absorption of PCPDTBTSO$_3$K can be modulated by addition of acid or base. As shown in FIG. 3a, the 1150 nm peak increases upon addition of 10 equiv HCl (relative to monomer units), and is absent when 10 equiv KOH are added. Electron paramagnetic resonance (EPR) measurements (FIG. 3b) of PCPDTBTSO$_3$K (after dialysis) solution show a signal with narrow line shape (peak-to-peak line width $\Delta H_{pp}$=4.0 G) and a g-value (g=2.0001), consistent with the presence of unpaired electrons [25]. The intensity of this peak correlates with the band at 1150 nm, indicating that this optical transition is proportional to the number of free radical species. By analogy to previous studies on self-doped polymers [26-29], it seems reasonable that doping proceeds via a mechanism that involves initial protonation of the backbone, followed by comproportionation with a non-protonated chain, ultimately leading to the formation of polarons (radical cations) [29-30].

Figure 4:
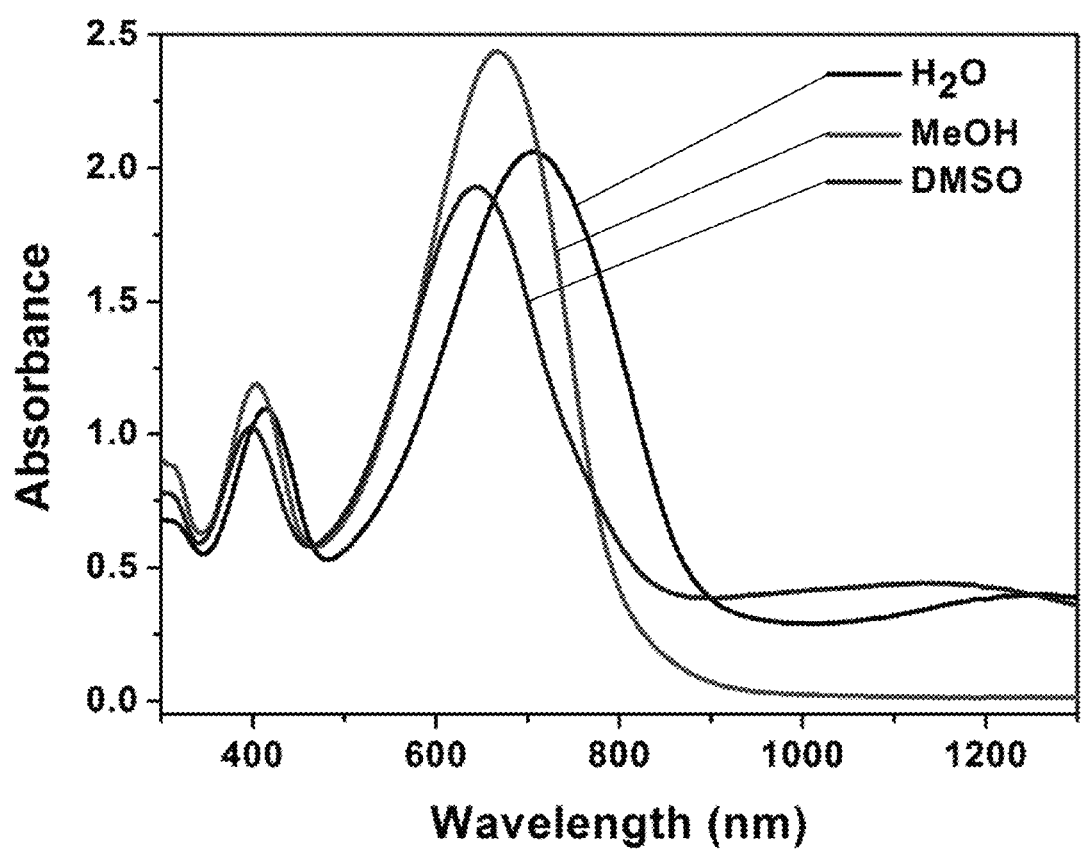
FIG. 4 shows UV-Vis-NIR absorptions of PCPDTBTSO$_3$TBA in different polar solvents: water (H$_2$O) (black), methanol (MeOH) (red), and dimethyl sulfoxide (DMSO) (blue).

Having access to PCPDTBTSO$_3$TBA, allows us to examine how the nature of the medium influences the degree of doping [31-34]. The absorption spectra of PCPDTBTSO$_3$TBA after dialysis in different solvents are shown in FIG. 4. Polaron absorption is observed in protic solvents (H$_2$O and MeOH), but not in an aprotic solvent (DMSO). In general, the pKa values of protic acids are higher in aprotic solvents, such as DMSO. For example, the pKa of CH$_3$SO$_3$H decreases by approximately three units when going from DMSO (pKa=1.6) to water (pKa=−2.6) [35]. It stands to reason that in DMSO the sulfonate groups behave in a manner similar to KOH in water, namely they inhibit protonation of the backbone, or deprotonate any sites, by virtue of being more basic in this medium.

Figure 5:
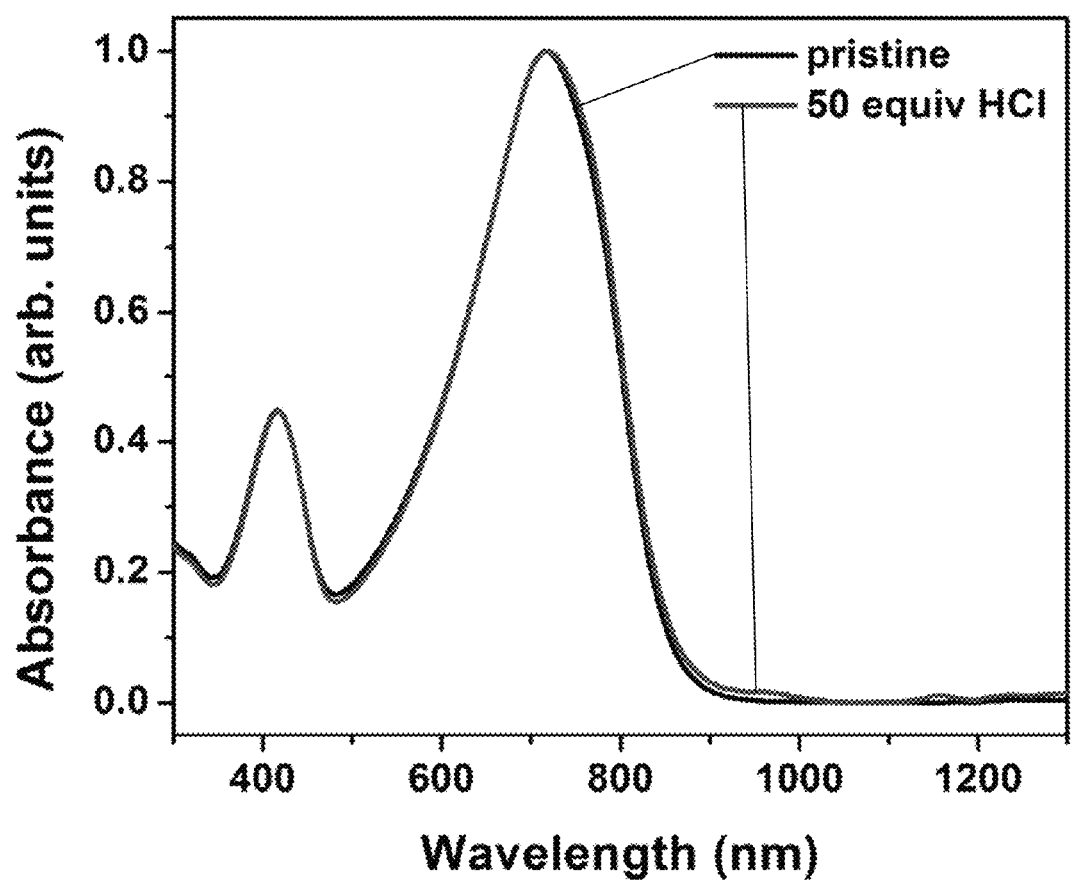
FIG. 5 shows UV-Vis-NIR absorptions of PCPDTBT-Pyr$^+$BIm$_4^-$ in 1:1 H$_2$O:MeOH: pristine (black), and after addition of 50 equiv HCl (red).

Comparison of PCPDTBT-Pyr$^+$BIm$_4^-$ with PCPDTBTSO$_3$K and PCPDTBTSO$_3$TBA allows one to keep the backbone structure constant and examine the role of electrostatic contribution by the pendant groups [36-37]. As shown in FIG. 5, one finds that the absorption of PCPDTBT-Pyr$^+$BIm$_4^-$ is similar to that of PCPDTBTSO$_3$K in the presence of KOH. More importantly, no changes are observed when 50 equiv HCl are added to PCPDTBT-Pyr$^+$BIm$_4^-$. These data indicate that the anionic groups are important for stabilizing the (cationic) polaronic states and this most simply appears to be as a result of coulombic stabilization.

Figure 6A:
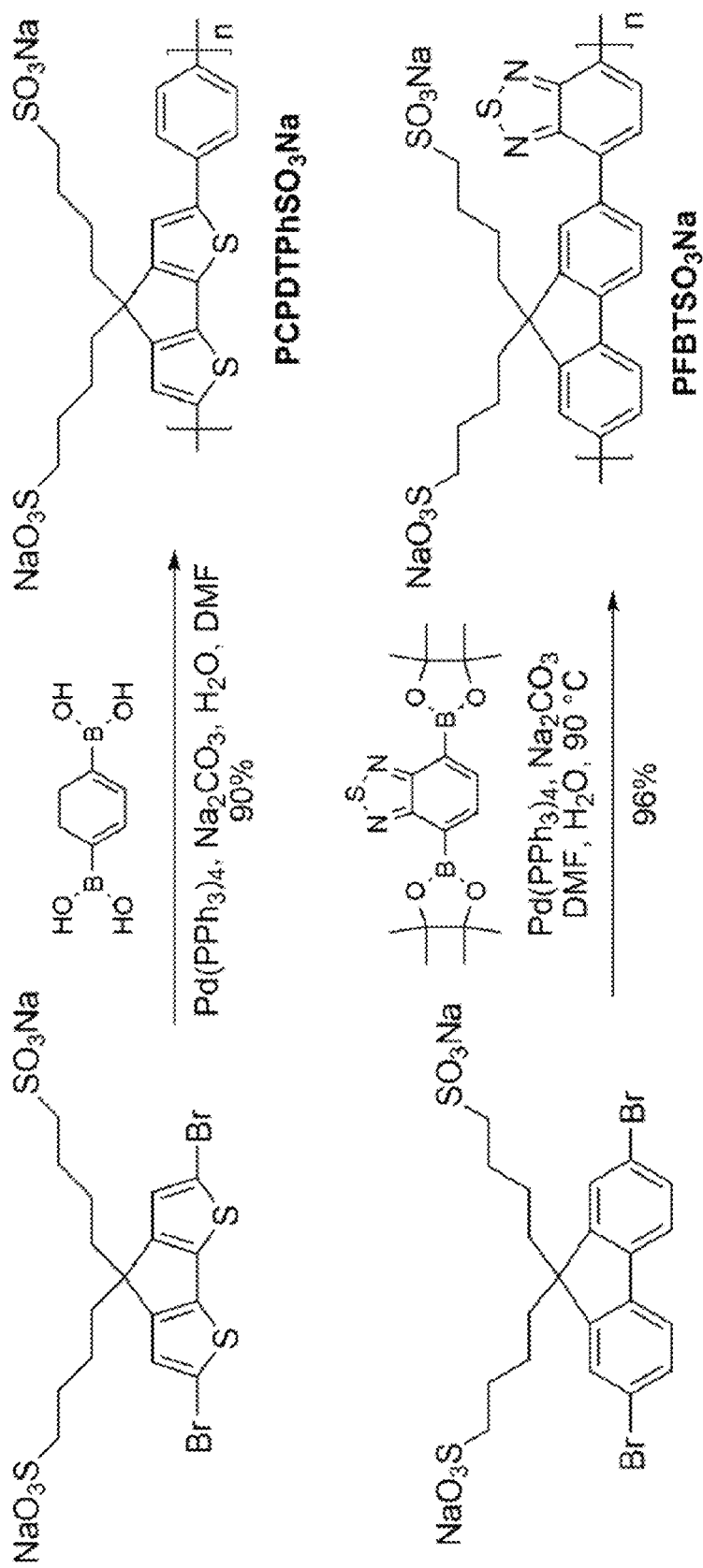
FIG. 6(a) shows synthesis and structures of conjugated polyelectrolytes PCPDTPhSO$_3$Na and PFBTSO$_3$Na.
Figure 6B:
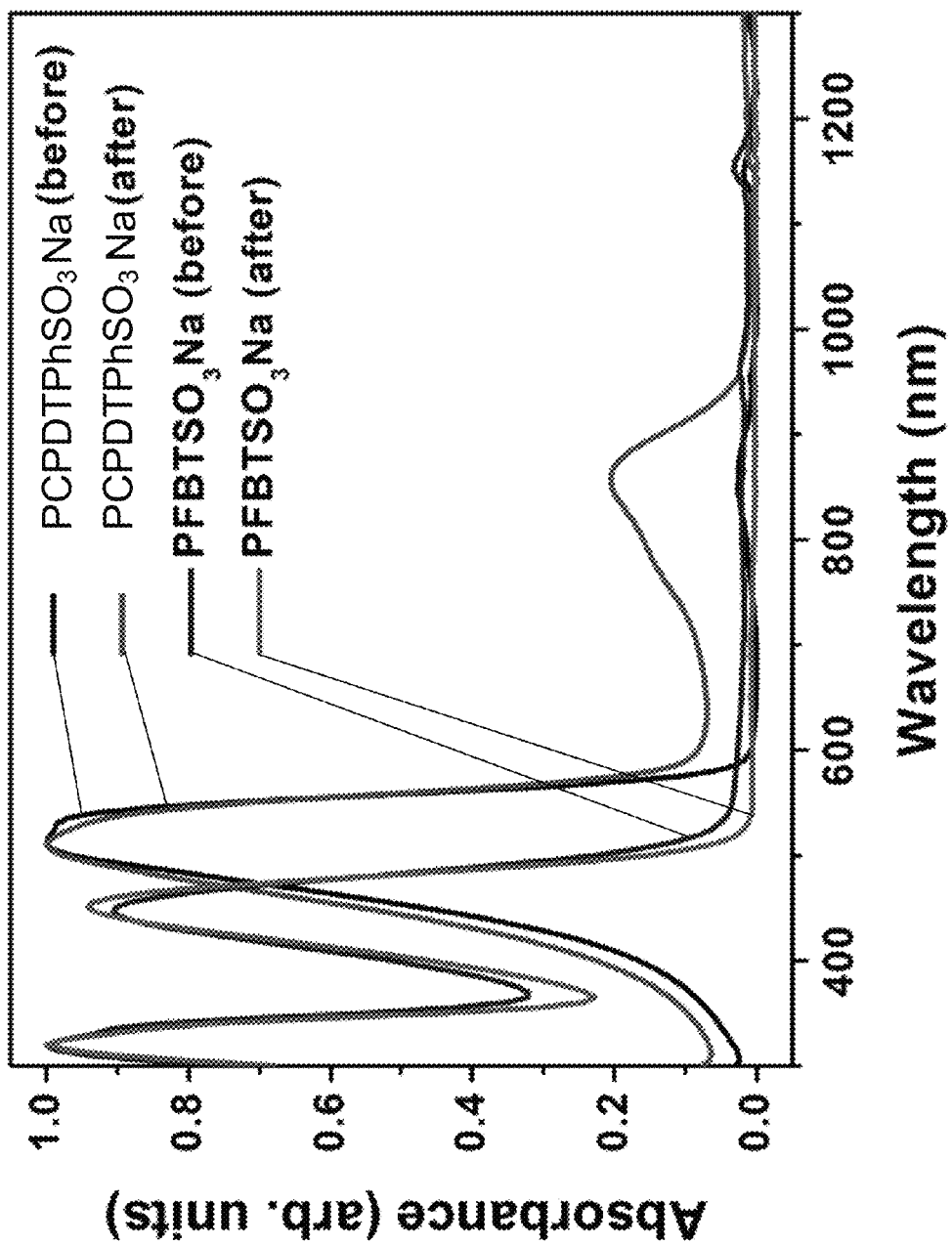
FIG. 6(b) shows UV-Vis-NIR absorption spectra of PCPDTPhSO$_3$Na and PFBTSO$_3$Na in aqueous solutions, showing PCPDTPhSO$_3$Na: before dialysis (black), after dialysis (red); PFBTSO$_3$Na: before dialysis (blue), after dialysis (green).

As shown in FIG. 6(a), two anionic CPEs, PCPDTPhSO$_3$Na and PFBTSO$_3$Na, were prepared to probe which particular structural units in PCPDTBTSO$_3$K are most significant for the doping process. In PCPDTPhSO$_3$Na, the benzothiadiazole (BT) heterocycle in PCPDTBTSO$_3$K is replaced with a phenyl fragment, which is less electron deficient [38]. In PFBTSO$_3$Na, the CPDT unit in PCPDTBTSO$_3$K, is replaced with the weaker donor fluorene fragment [39]. Detailed procedures for the synthesis, purification, and characterization can be found in the Supporting Information of [80]. Absorption spectra of PCPDTPhSO$_3$Na and PFBTSO$_3$Na, before and after dialysis, are provided in FIG. 6(b). One observes that the spectrum of PCPDTPhSO$_3$Na (after dialysis) exhibits a broad transition extending from 600 nm to 1000 nm, while that of PFBTSO$_3$Na does not provide evidence of polaron absorption. These experiments highlight the importance of incorporating CPDT into the polymer backbone.

TABLE 1

Summary of frontier molecular energy levels (in eV) obtained via UPS, UV-Vis-NIR absorption and CV.

| Polymer | IP[a] | EA[b] | E$_g$[c] | HOMO[d] | LUMO[d] | E$_g$[d] |
|---|---|---|---|---|---|---|
| PCPDTBTSO$_3$K | 4.87 | 3.49 | 1.38 | −4.83 | −3.54 | 1.29 |
| PCPDTPhSO$_3$Na | 4.92 | 2.78 | 2.14 | −5.11 | −2.82 | 2.29 |
| PFBTSO$_3$Na | 5.38 | 2.98 | 2.44 | −5.76 | −3.07 | 2.69 |

[a]From UPS measurements.
[b]Estimated by using the IP value and the optical bandgap E$_g$.
[c]Estimated from onsets of the absorptions of the undoped materials.
[d]From CV measurements.

Frontier molecular orbital energy levels were estimated by using ultraviolet photoelectron spectroscopy (UPS) and cyclic voltammetry (CV). Experimental details can be found in the Supporting Information of [80] and a summary of the most relevant findings is provided in Table 1. PCPDTBTSO$_3$K possesses the narrowest bandgap, lowest ionization potential (IP) (and therefore highest HOMO energy level), and the largest electron affinity (EA)(and therefore deepest LUMO energy level). The IP of PCPDTPhSO$_3$Na (4.92 eV) is similar to that of PCPDTBTSO$_3$K (4.87 eV). PFBTSO$_3$Na has the broadest bandgap and highest IP (5.38 eV) among the three CPEs. These trends are consistent with the electronic properties of the structural units. Moreover, the observation that doping occurs for the materials with lowest IPs is consistent with previous reports on how protonic acids can function as non-oxidative dopants for conjugated polymers: polymers with higher IP values require stronger acids for doping [73-74]. Since PCPDTBTSO$_3$K(TBA), PCPDTPhSO$_3$Na and PFBTSO$_3$Na bear the same sulfonate side chains, these findings indicate that electron-rich heterocycles, CPDT in our case, which provide D-A polymers with lower IP, should favor doping via dialysis.

Figure 7:
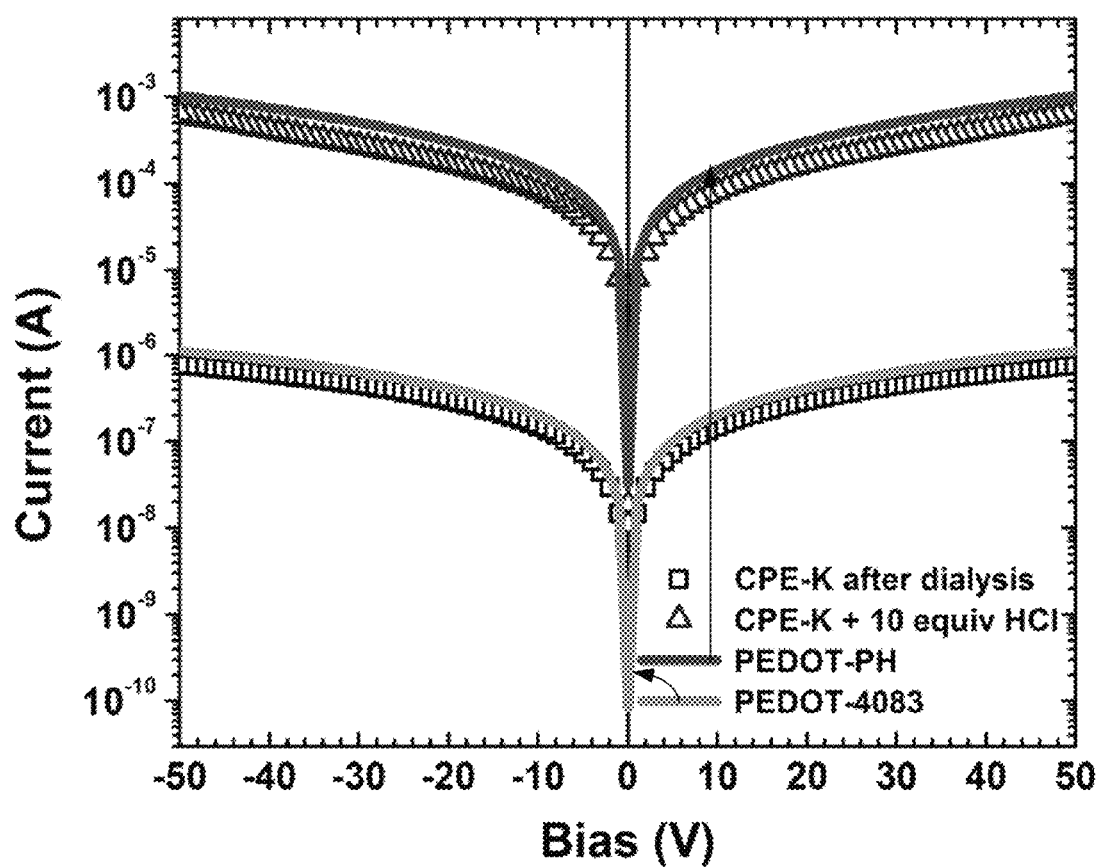
FIG. 7 shows Current-Voltage plots of thin films: PCPDTBTSO$_3$K (after dialysis, black, squares), PCPDTBTSO$_3$K with 10 equiv HCl added (blue, triangles), PEDOT-PH (green, solid line), and PEDOT 4083 (yellow, solid line).

Doping of conjugated polymers is known to increase electrical conductivity [40]. We thus measured the current-voltage response of PCPDTBTSO$_3$K thin films by adapting a field effect transistor (FET) device configuration, and the results are shown in FIG. 7. Adding 10 equiv. of HCl significantly improves the electrical conductivity of PCPDTBTSO$_3$K (after dialysis), while adding 10 equivalent of KOH provides a non-conducting material, with a conductivity that is below the measurable limit of our experimental set-up (<10$^{-12}$ S/cm). These findings are consistent with the EPR measurements (FIG. 3b). From a practical perspective, it is interesting to note that, as shown in FIG. 7, the electrical conductivity of PCPDTBTSO$_3$K (after dialysis) is comparable with or better than a widely used commercially available conducting polymer, namely PEDOT:PSS (poly(3,4-ethylenedioxythiophene) poly (styrenesulfonate) [41]. This conductivity of PCPDTBTSO$_3$K, together with its low acidity (pH=7.56, 1.0 mg/mL in water), renders it a promising material for applications in organic electronics.

In conclusion, we designed and synthesized an example of an anionic narrow band gap conjugated polyelectrolyte, PCPDTBTSO$_3$K. Ion exchange of charge compensating cations, i.e. K vs. TBA, can be used to modulate solubility and thereby aid structural characterization. Purification by standard dialysis provides a material that is intrinsically doped, as determined by optical absorption and EPR spectroscopies. Electrical conductivity measurements are also consistent with a doped material. Protic solvents that lower the basicity of the sulfonate groups are important for favoring backbone doping (as opposed to sulfonic acid formation). That PCPDTBTSO$_3$K(TBA) is doped under acidic conditions that leave PCPDTBT-Pyr$^+$BIm$_4^-$ unperturbed highlight the importance of the pendant group charges. We presume that the anionic groups stabilize the positive charge on the backbone via electrostatic interactions. Moreover, comparison of PCPDTBTSO$_3$K(TBA) with PCPDTPhSO$_3$Na and PFBTSO$_3$Na allows us to highlight that doping is favored by the presence of CPDT. This fragment is known to be a strong donor in the construction of narrow band gap conjugated polymers and implies that it exhibits a low ionization potential. Given the wide number of related structures, one can envision a new diversity of easy to prepare conducting polymers. Moreover, the intrinsic conductivity renders these doped CPEs as promising materials for organic electronics [42-45].

Figure 8:
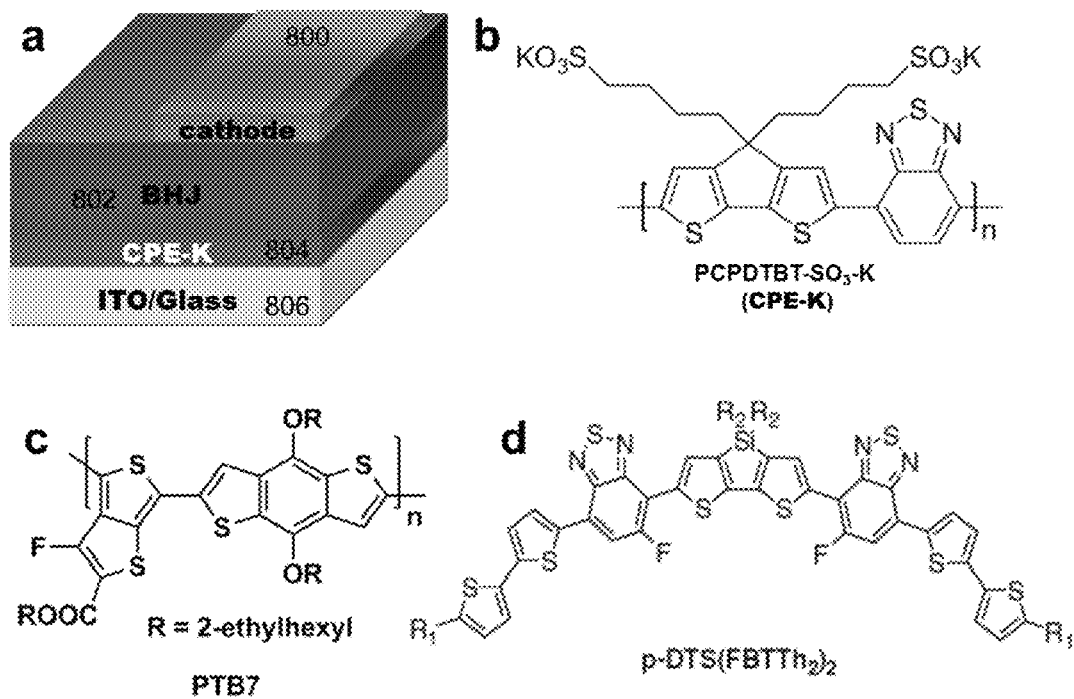
FIG. 8 (a) shows a device structure using solar cells incorporating CPE-K HTLs, wherein chemical structures of (b) poly[2,6-(4,4-bis-potassiumbutanylsulfonate-4H-cyclopenta-[2,1-b;3,4-b']-dithiophene)-alt-4,7-(2,1,3-benzothiadiazole)] (CPE-K), (c) PTB7, (d) p-DTS(FBTTh$_2$)$_2$ are also shown.

Conductive Conjugated Polyelectrolyte as Hole-Transporting Layer for Organic Bulk Heterojunction Solar Cells In this work, we demonstrate that high efficiency organic BHJ solar cells (device structure shown in FIG. 8a, comprising cathode 800, BHJ active region 802, HTL 804, and Indium Tin Oxide(ITO)/glass substrate 806) with PCEs up to 8.2% are successfully achieved when incorporating a water/alcohol soluble CPE HTL using solution processing. The pH neutral and conductive CPE-K comprised of a narrow band gap conjugated backbone with hydrophilic sides chains of potassium butane sulfonates (molecular structure shown in FIG. 8b), is incorporated as the HTL 804 in polymer:fullerene BHJ solar cells based on a low band gap donor material, thieno[3,4-b]-thiophene/benzodithiophene (molecular structure shown in FIG. 8c, PTB7) and [6,6]-phenyl C71-butyric acid methyl ester (PC$_{71}$BM) acceptor. This novel CPE-K acts as an efficient HTL not only because of its properties comparable with or better than PEDOT:PSS, such as solution processability, work function, electrical conductivity, and optical transparency; but also due to the CPE-K's intrinsic superiority in homogeneous conductivity and the CPE-K's pH neutral property. Thus, the device performance of CPE-K incorporated solar cells shows at least slight enhancement compared to the control devices using conventional PEDOT:PSS HTLs. The strategy of incorporating CPE-K HTLs is also applied to small molecule BHJ solar cells using 7,7'-(4,4-bis(2-ethylhexyl)-4H-silolo[3,2-b:4,5-b']dithiophene-2,6-diyl)bis(6-fluoro-4-(5'-hexyl-[2,2'-bithiophen]-5-yl)benzo[c][1,2,5]thiadiazole) (molecular structure shown in FIG. 8d, p-DTS(FBTTh$_2$)$_2$) as donor. For p-DTS(FBTTh$_2$)$_2$ solar cells, the devices using a CPE-K HTL show competitive performance with a PCE=7.2% compared with that using a PEDOT:PSS HTL (7.1%). These results demonstrate the general application of CPE-K as a hole transporting layer (HTL) for organic BHJ solar cells.

Figure 9:
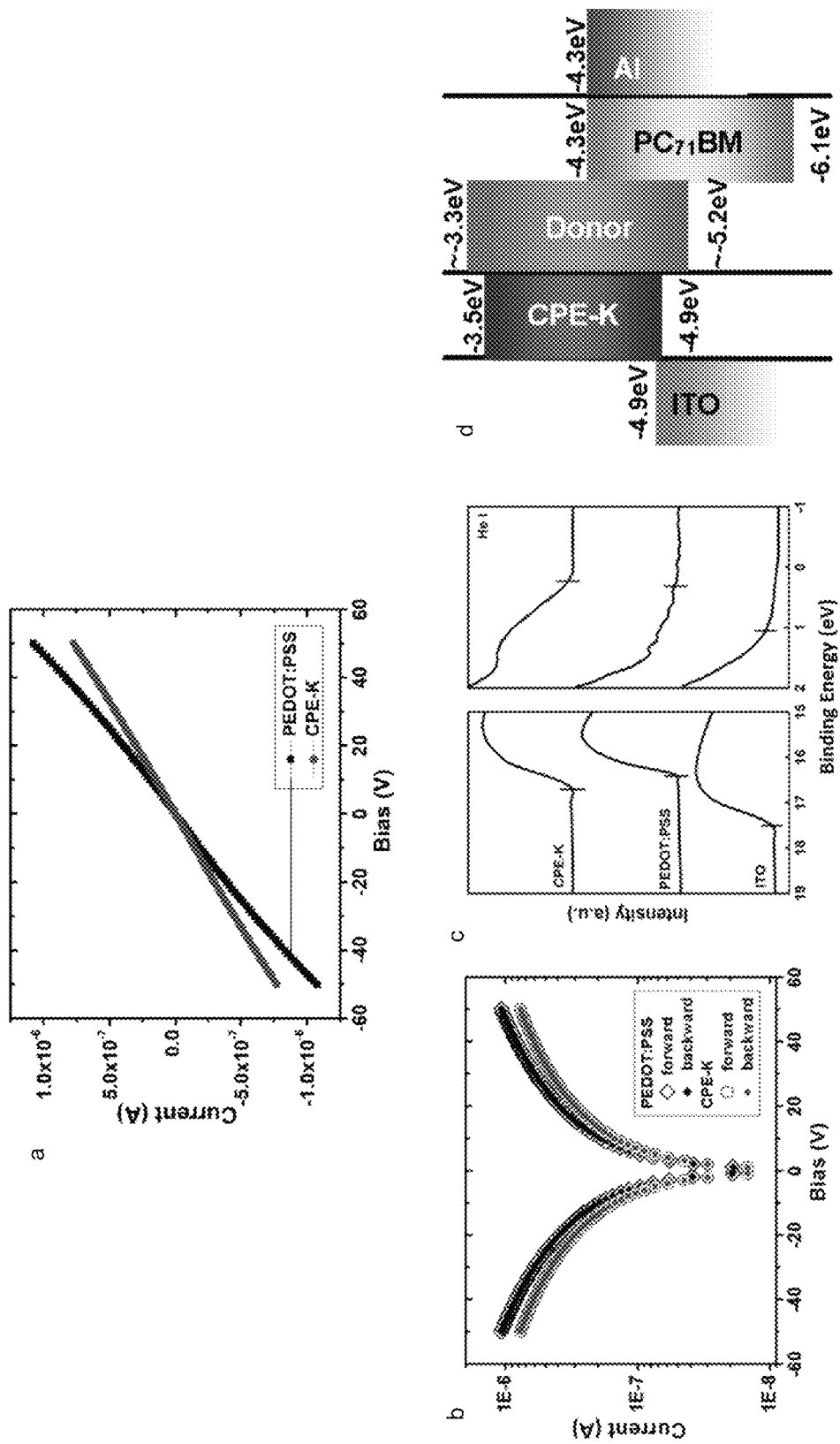
FIG. 9 shows (a) current versus voltage characteristics of PEDOT:PSS (squares) and CPE-K (circles) lateral diodes plotted on a linear scale, (b) current versus voltage characteristics of PEDOT:PSS (diamond) and CPE-K (circles) lateral diodes, wherein in order to check the electrical hysteresis, forward and backward scans are also included, (c) ultraviolet photoemission spectra of pristine ITO, PEDOT:PSS, and CPE-K deposited on top of ITO, and (d) an Energy diagram of the PTB7:$PC_{71}BM$ active layer sandwiched in between an ITO anode and an Al cathode incorporating the CPE-K hole injection layer.

The parallel electrical conductivity of CPE-K was measured by using a lateral diode structure with two parallel gold (Au) electrodes. Current-voltage (I-V) characteristics of CPE-K and commercial PEDOT:PSS 4083 are shown in FIG. 9a. The apparent linearity of the I-V curve measured for both HTL materials indicates an Ohmic transport in the applied bias regime. By using Ohm's law, an electric conductivity (σ) of $1.5 \times 10^{-3}$ S/cm was obtained for CPE-K, as compared to a σ=$2.7 \times 10^{-3}$ S/cm for PEDOT:PSS 4083. To examine the influence of the K$^+$ cations present in CPE-K, we measured the electric hysteresis in the forward and backward scans in FIG. 9b (in semi-logarithm scale). When the ion motion is substantial, the resultant re-screening of the electrical field can lead to a noticeable hysteresis in the current-voltage (I-V) scan [72]. In FIG. 9b, we do not observe the difference in the scan history, which indicates that ion motions in both CPE-K layer and PEDOT:PSS layer under the applied electric field are insignificant. The relatively high conductivity of CPE-K can originate from the self-doping occurring in the backbone of CPE-K [73]. This mechanism helps eliminate the inhomogeneity of electrical conduction in CPE-K as opposed to PEDOT:PSS. The pH value of this CPE-K is 7.56. Detailed research on the self-doping behaviors of CPE-K is discussed above.

FIG. 9c shows ultraviolet photoemission spectroscopy (UPS) of the CPE-K layer and PEDOT:PSS layers deposited on ITO and pristine ITO. We attain a HOMO of 4.9 eV for the CPE-K, which is 0.3 eV higher than that of PEDOT:PSS (5.2 eV). Based on the UPS result, the energy diagram for BHJ solar cells with the CPE-K hole transport layer is sketched in FIG. 9d. The HOMO of 4.9 eV of CPE-K can assure an Ohmic contact and satisfactory hole extraction from the donor materials.

TABLE 2

Device parameters of PTB7:PC$_{71}$BM solar cells using different HTLs and cathodes and CPE-K thickness, where PCE$_{ave}$ is the average PCE and PCE$_{max}$ is the maximum PCE.

| Device | | Voc (V) | Js (mA/cm$^2$) | FF (%) | PCE$_{ave}$/PCE$_{max}$ (%) |
|---|---|---|---|---|---|
| Al | | | | | |
| CPE-K | 5 nm | 0.67 ± 0.01 | 14.00 ± 0.23 | 61.1 ± 1.2 | 5.8 ± 0.2/6.0 |
| | 8 nm | 0.68 ± 0.01 | 13.38 ± 0.21 | 65.8 ± 1.1 | 6.0 ± 0.2/6.2 |
| | 12 nm | 0.68 ± 0.01 | 13.17 ± 0.22 | 63.5 ± 1.2 | 5.7 ± 0.2/5.9 |
| | 20 nm | 0.68 ± 0.02 | 13.01 ± 0.24 | 62.2 ± 1.3 | 5.5 ± 0.2/5.7 |
| PEDOT:PSS | 30 nm | 0.71 ± 0.02 | 12.36 ± 0.25 | 61.4 ± 1.5 | 5.4 ± 0.3/5.7 |
| MeOH/Ca/Al | | | | | |
| CPE-K | 8 nm | 0.71 ± 0.01 | 16.29 ± 0.21 | 68.8 ± 1.0 | 8.0 ± 0.2/8.2 |
| PEDOT:PSS | 30 nm | 0.75 ± 0.01 | 15.37 ± 0.21 | 66.5 ± 1.0 | 7.7 ± 0.2/7.9 |

Figure 10:
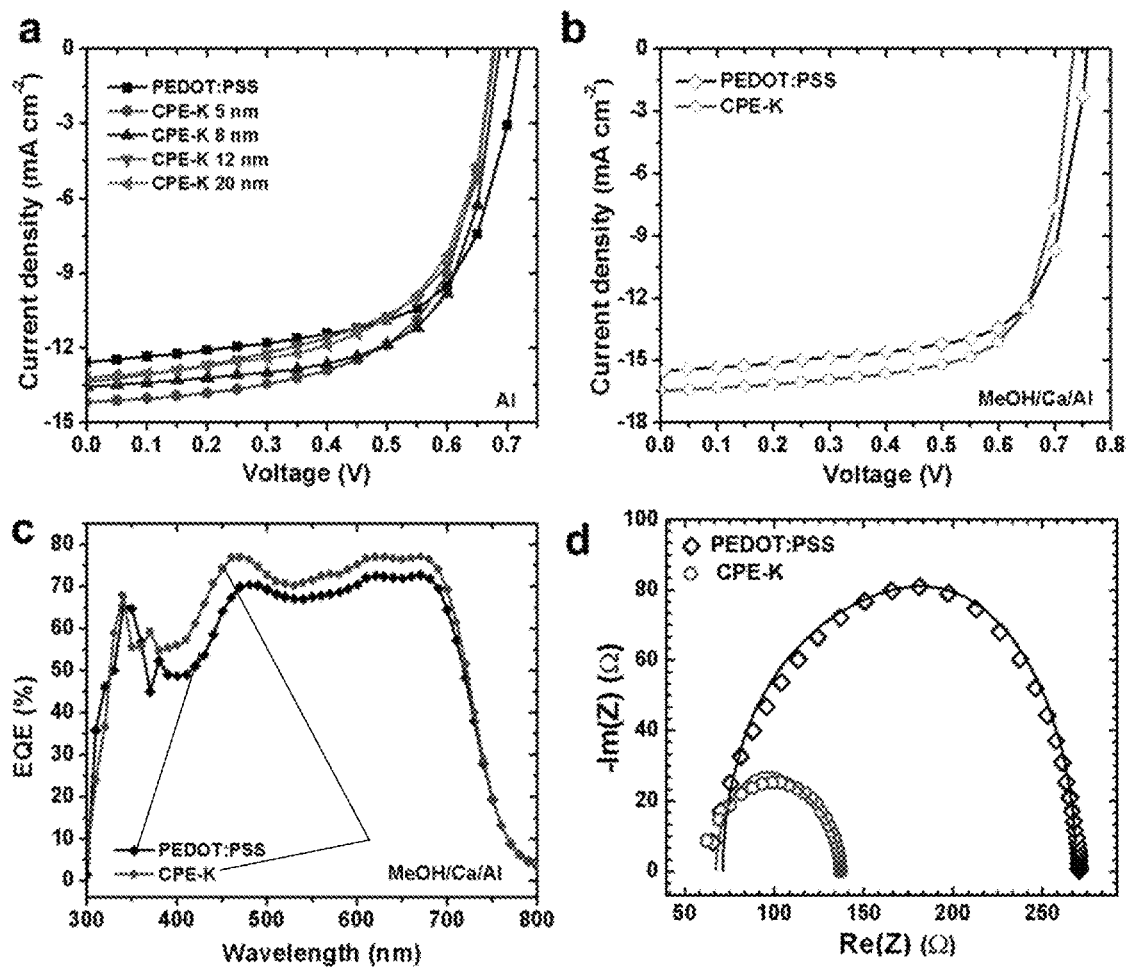
FIG. 10 shows (a) Current density versus voltage (J-V) curves of PTB7:$PC_{71}BM$ solar cells measured under 100 milliwatt per centimeter square ($mW/cm^2$) irradiation with HTLs of PEDOT:PSS or CPE-K with film thicknesses of 5 nanometers (nm), 8 nm, 12 nm, and 20 nm, using an aluminum (Al) cathode, (b) J-V curves after methanol treatment, (c) External quantum efficiency (EQE) spectra of PTB7:$PC_{71}BM$ solar cells using PEDOT:PSS or CPE-K (8 nm thick) HTLs and a Ca/Al cathode with methanol treatments, and (d) Nyquist plots of the impedance of PTB7:$PC_{71}BM$ solar cells with PEDOT:PSS and CPE-K as hole transport layers measured under 100 $mW/cm^2$ irradiation at $V_{oc}$.

Current density-voltage (J-V) characteristics under AM 1.5 G irradiation (100 mW cm$^{-2}$) of PTB7:PC$_{71}$BM solar cells with CPE-K HTLs and Al cathode are shown in FIG. 10a. Detailed device parameters are summarized in Table 2. The optimal thickness of CPE-K HTL is found to be around 8 nm as measured by profilometry. The CPE-K device with optimized HTL thickness displays a PCE=6.2% with a J$_{sc}$=13.5 mA/cm$^{-2}$, V$_{oc}$=0.69 V, and Fill Factor FF=0.66. In contrast, the PEDOT:PSS control shows a PCE=5.7%. To further optimize the device performance, methanol treatment prior to the deposition of calcium/aluminum (Ca/Al) cathode was performed in PTB7:$PC_{71}BM$ solar cells [76]. A simultaneous enhancement of $V_{oc}$, $J_{sc}$, and FF has been observed in both devices; the J-V curves are shown in FIG. 10b. The performance of CPE-K HTL devices with a PCE=8.2% is slightly enhanced with a larger $J_{sc}$, a better FF, and a smaller $V_{oc}$ compared with PEDOT:PSS HTL devices which yield a PCE=7.9%. The slight decrease in $V_{oc}$ can be ascribed to a shallower HOMO for CPE-K (~4.9 eV) when compared to that of PEDOT:PSS (~5.0 eV), leading to a larger offset with the HOMO of PTB7 (~5.2 eV) [77-78]. FIG. 10c shows the incident photon conversion efficiency (IPCE) spectra of the same devices. An increase of IPCE at wavelengths between 350 nm and 700 nm is observed for CPE-K devices in comparison to the PEDOT:PSS control device, which leads to a larger $J_{sc}$ increased from 15.46 $mA/cm^{-2}$ to 16.32 $mA/cm^{-2}$ under integration. The maximum IPCE in CPE-K HTL devices is over 70%, indicative of efficient photon-to-electron conversion. J-V characteristics under dark condition (Figure S2a in [81]) indicate that good diode characteristics were obtained from both devices using PEDOT:PSS and CPE-K HTLs.

To further understand the improvement of device characteristics, we measured the series resistance ($R_s$) by impedance analysis when operating the solar cell under $V_{oc}$ condition upon 100 mW $cm^{-2}$ irradiation. FIG. 10d shows Nyquist plots of the measured impedance for PTB7:$PC_{71}BM$ with PEDOT:PSS and CPE-K HTLs, respectively. Note that the CPE-K containing device has a significantly reduced bulk resistance as indicated by the decreased radius in the Nyquist plot [76]. Since PEDOT:PSS and CPE-K HTLs both assure an Ohmic injection with regard to the HOMO of PTB7 (5.2 eV), the decrease in the bulk resistance should primarily result from the modification of the HTL/PTB7:$PC_{71}BM$ interface. The $R_s$ of the solar cell under irradiation is determined by extrapolating the impedance to the x-axis as shown in FIG. 10d. Interestingly, $R_s$ is decreased from 3.2 $\Omega cm^2$ to 3.0 $\Omega cm^2$ when replacing the PEDOT:PSS HTL with CPE-K, which results in a better FF in device performance [76].

Conductive atomic force microscopy (c-AFM) was performed to study the local charge transport in the vertical direction in PEDOT:PSS HTL and CPE-K HTL. Current images of PEDOT:PSS (30 nm thick) and CPE-K (8 nm thick) thin films measured at +50 mV are comparatively shown in FIGS. 11a and 11b. The different thickness for these two layers reflects the real condition used in solar cell devices. For c-AFM, the current was measured by applying a positive bias to the ITO substrates while keeping the Au tip grounded. Due to the deep work function of Au (5.1 eV) and ITO (4.9 eV), the current is mainly carried by holes and electron injection is effectively blocked. The magnitude of current in c-AFM then indicates the local hole conductivity of the HTLs. It has been found that the vertical electrical conductivity in spin-cast PEDOT:PSS thin films is up to 3 orders lower than that along the parallel direction, due to the lamellar structure of PEDOT and the insulating PSS [54-57, 79]. The anisotropy in electrical conductivity is preferentially reduced in CPE-K which is attributed to the self-doping occurring in the polymer backbone. For a more detailed view of local current structure, current images over 250 nm square regions were also obtained (insets to FIGS. 11a and 11b), with the PEDOT:PSS sample measured at +1V to obtain better contrast (for a 250 nm image of PEDOT:PSS at +50 mV at the same current scale, see Figure S3 of [81]).

Due to instrumental current saturation in the CPE-K sample at relatively low biases (±200 mV), the applied bias was minimized. From the Inset in FIG. 11a, we note that the brighter, more conductive regions in the PEDOT:PSS HTL are surrounded by darker, lower current regions, indicative of the individual conductive PEDOT and insulating PSS domains, respectively. Instead, in CPE-K, a more homogeneous current map is observed (Inset in FIG. 11b). The comparison of c-AFM images of 10 nm thick PEDOT:PSS, 30 nm thick PEDOT:PSS, and 8 nm thick CPE-K (FIG. 12) clearly shows the thickness of PEDOT:PSS doesn't affect hole transport significantly and 8 nm CPE-K film has superior hole transport ability than PEDOT:PSS films both for 10 nm and 30 nm thicknesses. The higher and more uniform hole conduction in CPE-K helps improve the hole extraction and consequently the $J_{sc}$ in the solar cell when using the CPE-K as HTLs.

Figure 11:
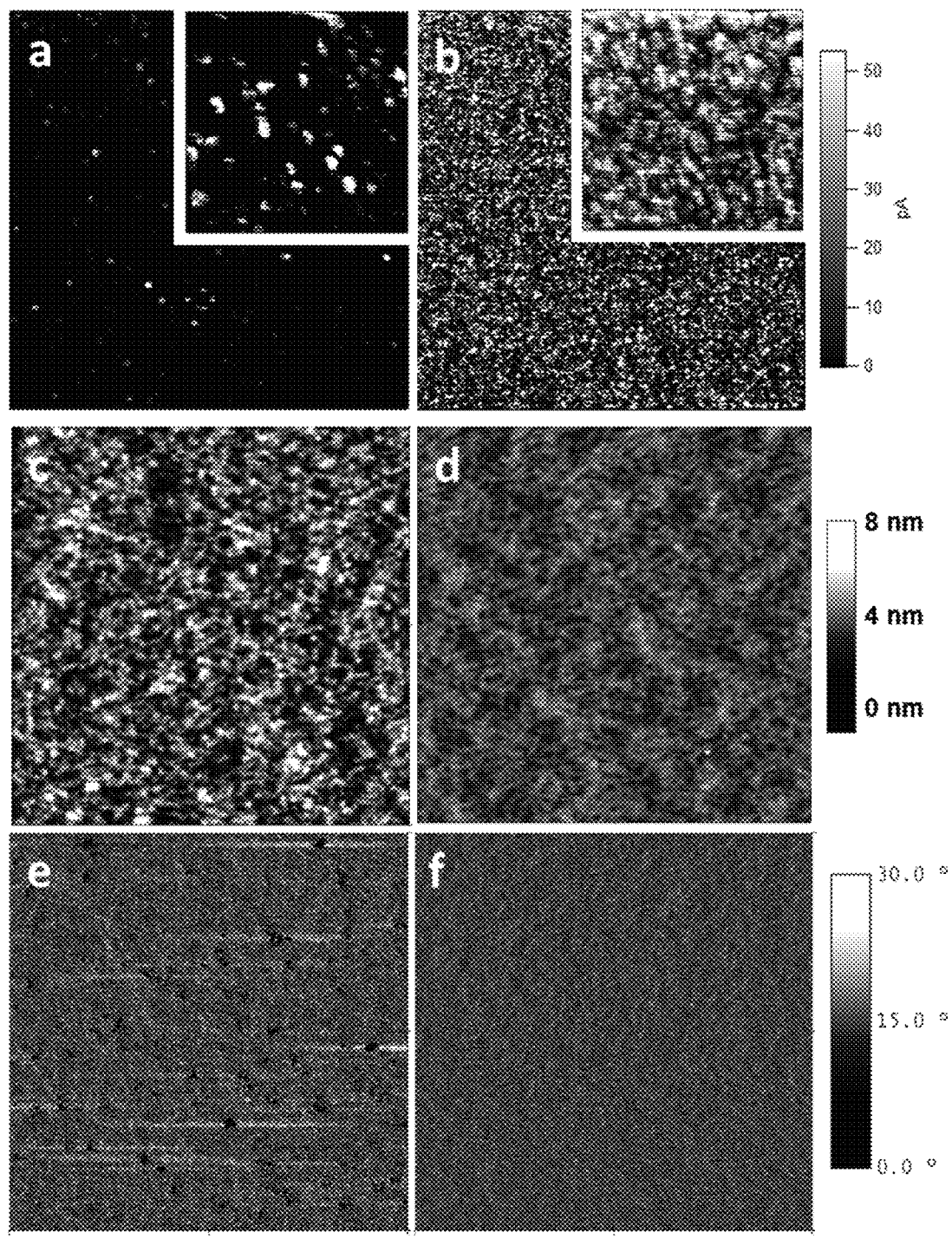
FIG. 11 shows conductive atomic force microscope (c-AFM) current images (size: 1 micrometer (μm)×1 μm, current legend in picoamps (pA)) of (a) PEDOT:PSS and (b) CPE-K HTLs on ITO at +50 millivolts (mV), wherein the insets show current images in a small area scan (0.25 μm×0.25 μm) at +1 V for PEDOT:PSS; at +50 mV for CPE-K; also shown are atomic force microscope (AFM) surface topographic images (size: 5 μm×5 μm, surface roughness legend in nanometers (nm)) of c) PEDOT:PSS, and d) CPE-K layers, and AFM phase images (size: 5 μm×5 μm, phase legend in degrees °) of bottom interfaces of a PTB7 BHJ on e) PEDOT:PSS, and f) CPE-K, wherein the scale bars for a) and b), c) and d), e) and f) are the same and all of them are on the right side.
Figure 12:
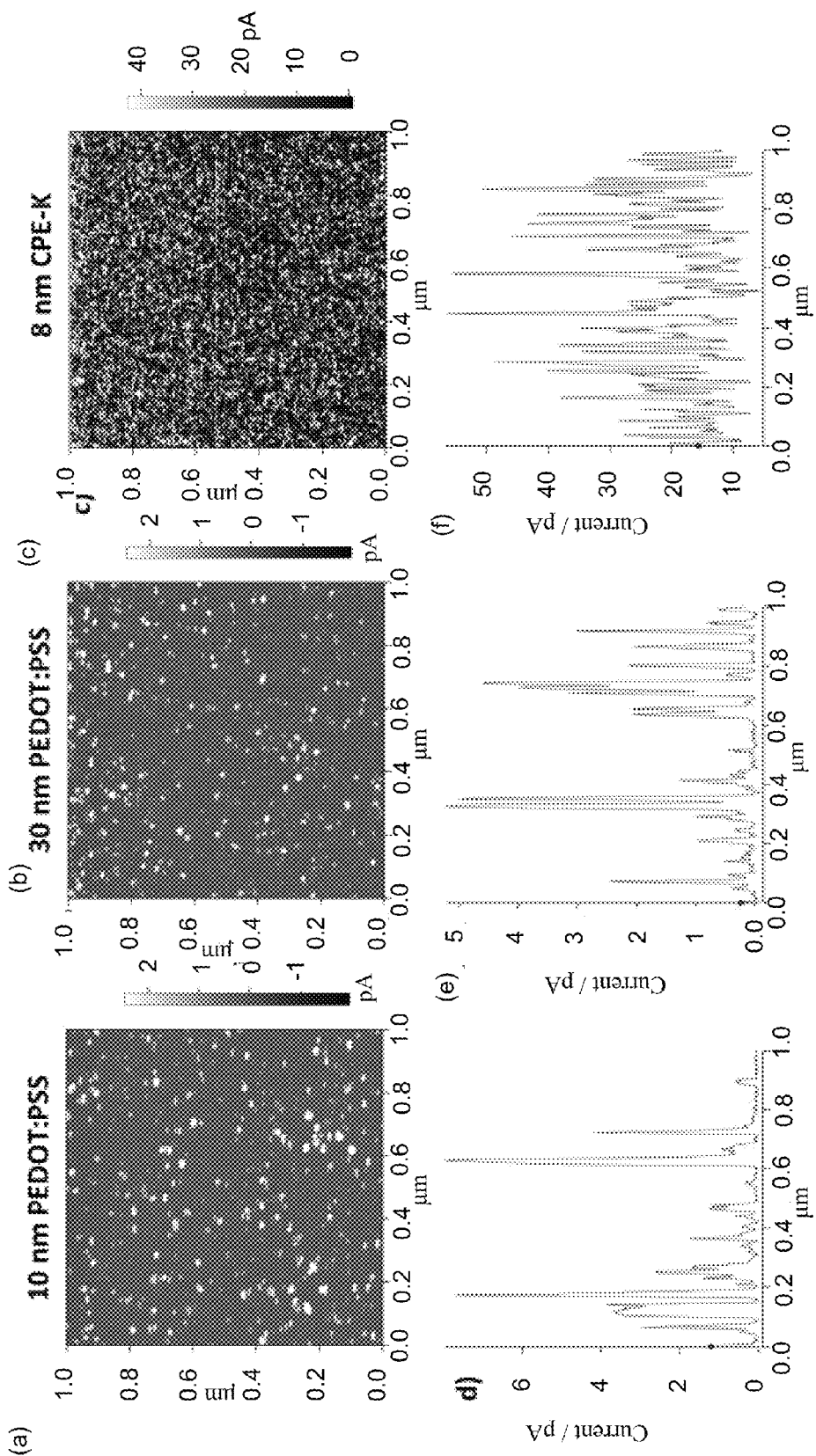
FIG. 12 shows c-AFM images (size: 1 micrometer (μm)×1 μm) of a) PEDOT:PSS 4083 (10 nm thick), b) PEDOT:PSS 4083 (30 nm thick), c) CPE-K (8 nm thick) at +50 mV, and in d)-f), current profiles corresponding to a)-c), where current is measured in picoamps (pA).
Figure 13:
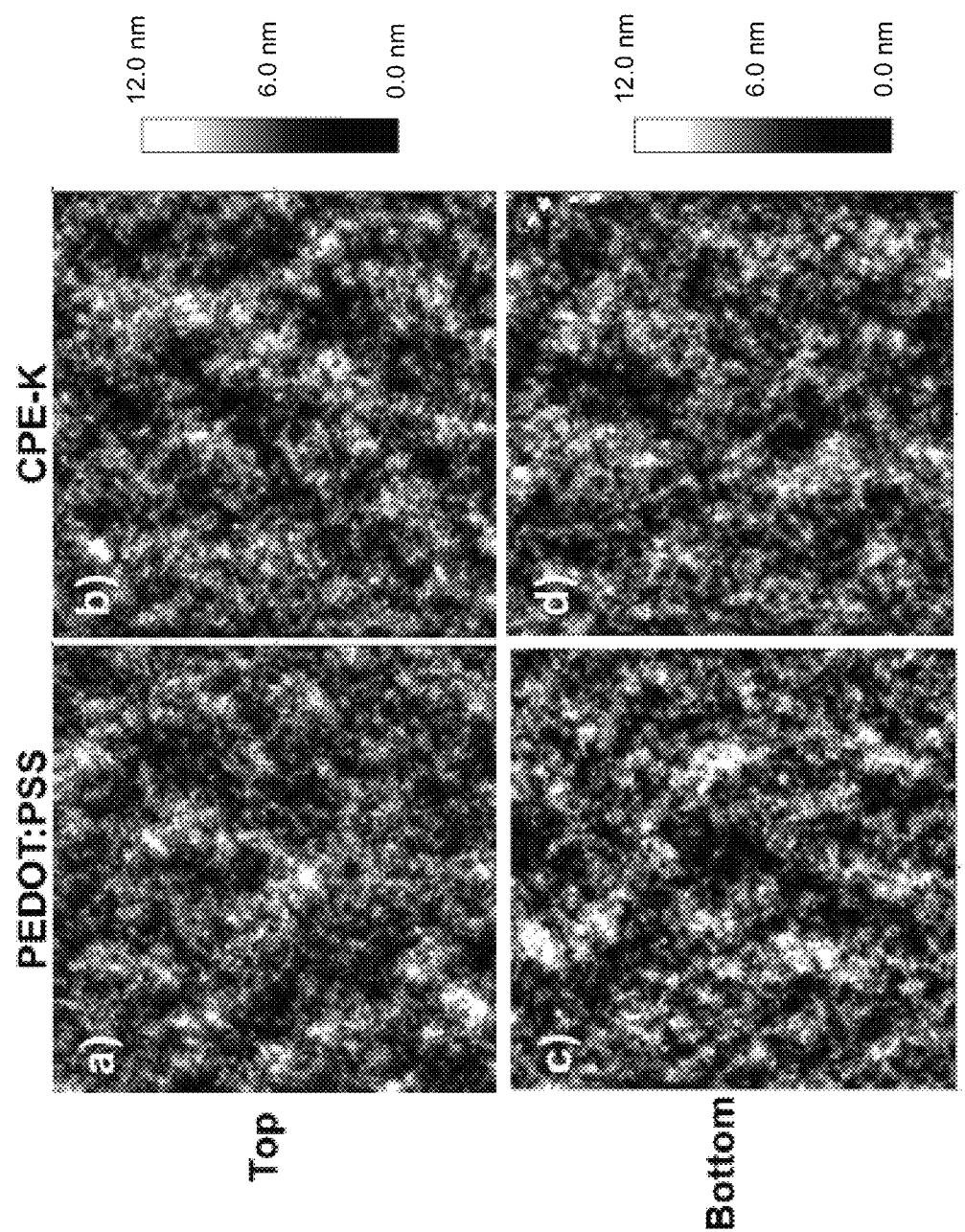
FIG. 13 shows AFM surface topographic images (size: 5 μm×5 μm) of the top surface of PTB7:PC71BM active layers on HTLs of (a) PEDOT:PSS, and (b) CPE-K, and AFM surface topographic images (size: 5 μm×5 μm) of bottom interfaces of PTB7:PC71BM active layers peeled off from HTLs of (c) PEDOT:PSS, and (d) CPE-K.
Figure 14:
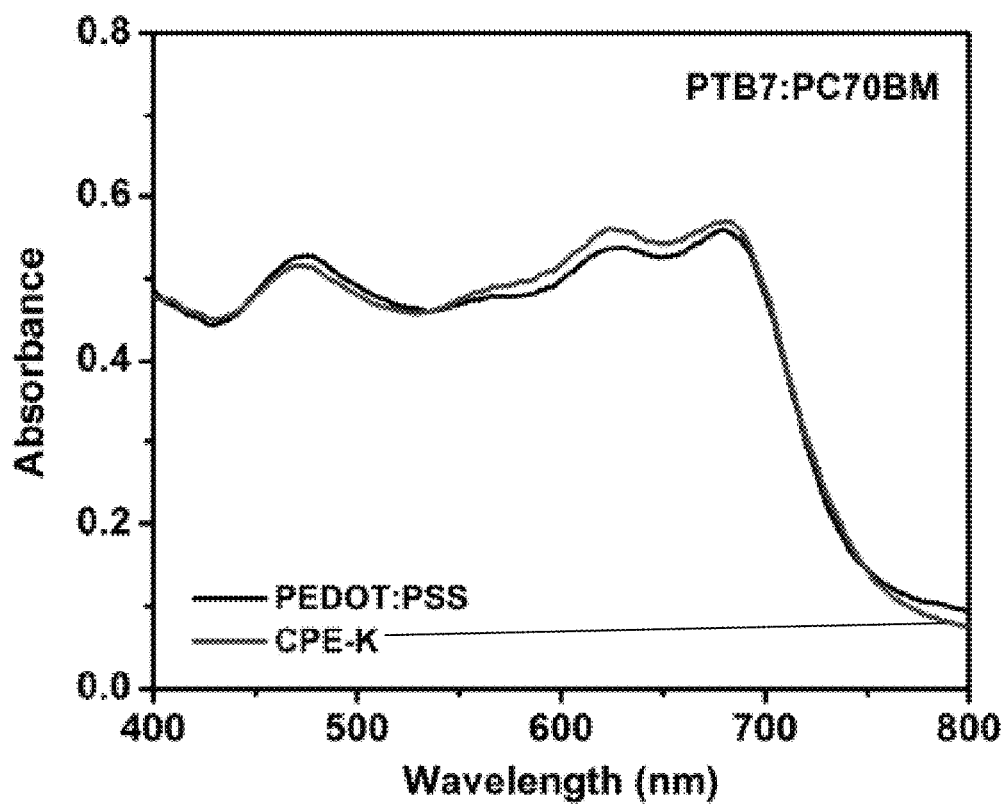
FIG. 14 shows Absorption spectra of PTB7:PC71BM active layers on PEDOT:PSS and CPE-K HTLs.

In conventional solar cells, surface properties of HTLs deposited on top of the ITO anode can significantly affect the morphology of the active layer, further dictating the light harvesting, exciton dissociation, charge transport and charge collection in organic BHJ solar cells [65]. To examine the impact of the CPE-K interlayer on the morphology of PTB7:$PC_{71}BM$ active layer, we first measured pristine surfaces of CPE-K together with PEDOT:PSS. FIG. 11c and FIG. 11d show topographic images of PEDOT:PSS and CPE-K surfaces acquired by AFM. Both films display a featureless structure, and we observe a reduced surface roughness of CPE-K with root mean square (RMS) surface roughness of 0.74 nm when compared with the RMS of PEDOT:PSS (0.93 nm). The improved surface smoothness of CPE-K provides a more satisfactory interface with the PTB7:$PC_{71}BM$ active layer. The AFM topography images of PTB7:$PC_{71}BM$ active layers on PEDOT:PSS and CPE-K (FIGS. 13a, 13b) show similar surface morphology. Besides, the absorption spectra of PTB7:$PC_{71}BM$ active layers on PEDOT:PSS and CPE-K HTLs (see FIG. 14) do not show obvious change, which indicates the molecular orientation of active layers hasn't been effected significantly by these two different HTLs. The morphology at PTB7:$PC_{71}BM$/HTL interfaces was further probed by floating/peeling off the PTB7:$PC_{71}BM$ active layer from the ITO/HTL by dissolving CPE-K or PEDOT:PSS interlayer in deionized water. We do not observe any obvious change in topography images of the PTB7:$PC_{71}BM$ bottom face when deposited on PEDOT:PSS HTL and CPE-K HTL, as shown in FIG. 13c-d. Differently, the phase image of the PTB7:$PC_{71}BM$ bottom face on top of the CPE-K interlayer (shown in FIG. 11e, 11f) exhibits more uniform structures compared with the PTB7:$PC_{71}BM$ bottom face on top of the PEDOT:PSS interlayer. The AFM images confirm a smoother interface between CPE-K/PTB7:$PC_{71}BM$, which helps reduce interfacial losses so that a higher $J_{sc}$ and FF are achieved.

Figure 15:
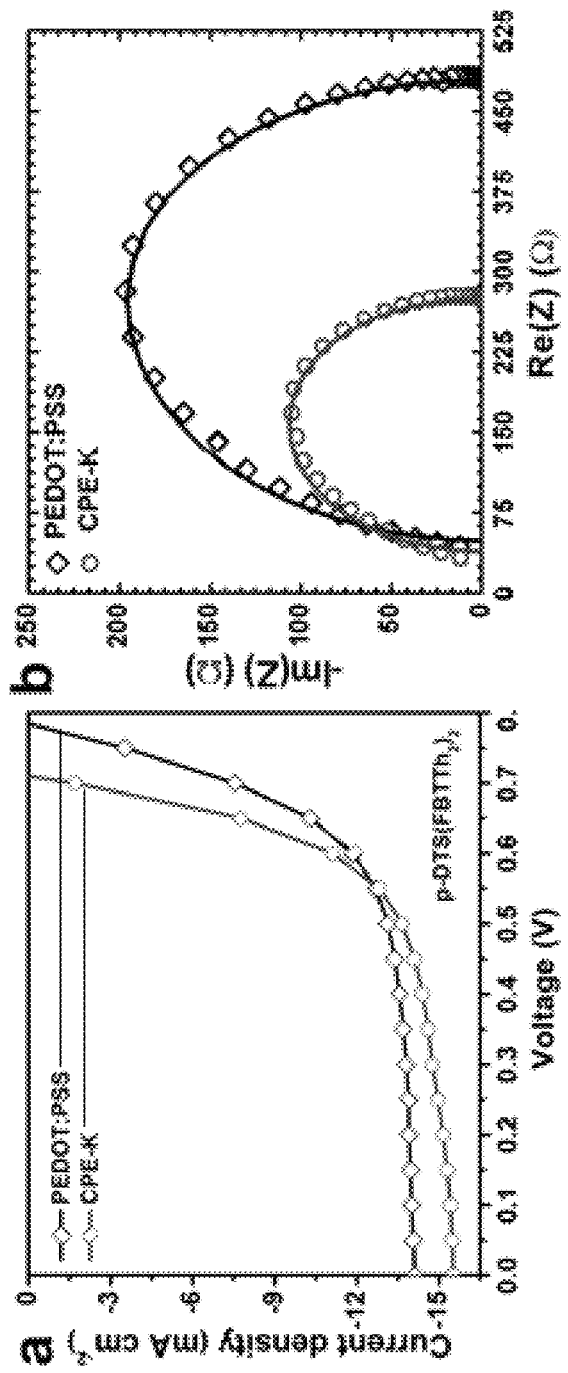
FIG. 15 shows (a) J-V curves of solar cells comprising of active layers of p-DTS(FBTTh$_2$)$_2$ incorporating PEDOT:PSS or CPE-K HTLs under 100 $mW/cm^2$ irradiation; and (b) impedance spectra (Nyquist plots) of p-DTS(FBTTh$_2$)$_2$:$PC_{71}BM$ using PEDOT:PSS and CPE-K as the HTL.

To explore the general applicability of the CPE-K HTL in organic solar cells, we investigate its influence on the device performance based on organic small molecular donor, p-DTS(FBTTh$_2$)$_2$. FIG. 15a shows J-V characteristics of solar cells constituted of p-DTS(FBTTh$_2$)$_2$:$PC_{71}BM$ photoactive layers with the two HTLs under 100 $mW/cm^2$ irradiation. Table 2 contains the detailed solar cell parameters. Incorporation of the CPE-K interlayer in small molecule p-DTS(FBTTh$_2$)$_2$:$PC_{71}BM$ solar cells leads to a high device performance showing a PCE=7.2%, which is comparable with that using PEDOT:PSS HTLs (7.1%). Similarly to the polymer PTB7:$PC_{71}BM$ solar cells, we observe an enlarged $J_{sc}$ and FF associated with a slightly decreased $V_{oc}$ in the p-DTS(FBTTh$_2$)$_2$:$PC_{71}BM$ device when incorporating CPE-K HTLs instead of PEDOT:PSS. The changes in device characteristics can be rationalized with a similar mechanism resulting from the CPE-K HTLs in the PTB7:PC$_{71}$BM device. FIG. 15b displays Nyquist plots of the impedance of p-DTS(FBTTh$_2$)$_2$:PC$_{71}$BM solar cells when measured at the V$_{oc}$ bias condition under 100 mW/cm$^2$ irradiation. For these small molecule devices, incorporation of the CPE-K interlayer leads to reduced bulk resistivity and R$_s$ as well. For p-DTS(FBTTh$_2$)$_2$ solar cells, R$_s$ decreases from 2.2 Ωcm$^2$ to 1.7 Ωcm$^2$ when replacing PEDOT:PSS HTL with CPE-K HTL. Rationalized by a similar argument as noted above, the reduced R$_s$ results in a better FF, beneficial for the device performance.

In conclusion, conductive conjugated polyelectrolyte CPE-K has been successfully incorporated in organic BHJ solar cells as hole-transporting layers through solution processing, showing PCE values up to 8.2%. CPE-K HTLs have been demonstrated with a general application in both polymer and small molecule BHJ systems with advantages including a more homogeneous interface and reduced R$_s$, compared with a conventional PEDOT:PSS HTL. These results illustrate a novel application of water/alcohol-soluble conjugated polyelectrolytes to serve as an efficient hole-transporting layer for organic BHJ solar cells, which contrasts the conventional usage as an electron-transporting layer. The pH neutral nature of CPE-K HTL makes it intrinsically superior to acidic PEDOT:PSS HTL for BHJ devices with materials containing lewis basic functionalities, due to the minimization of interfacial interactions. Further work will focus on modifying the HOMO energy level for such CPEs in order to further increase the V$_{oc}$ in the device performance.

Conductivity as Compared to PEDOT:PSS

The conductivity of PEDOT:PSS AI4083 measured above by the present inventors is 2.7×10$^{-3}$ S/cm, however the conductivity of commercial AI4083 is in the range of 2.0×10$^{-3}$ S/cm to 2.0×10$^{-4}$ S/cm (see [82] which contains conductivity information for AI4083). The CPE of one or more embodiments of the present invention, on the other hand, can be self doped via the dialysis such that the doped CPE has an electrical conductivity (hole conductivity) of at least σ=2×10$^{-4}$ S/cm or σ=2×10$^{-4}$ S/cm or more.

The electrical conductivity is a property of the CPE alone and should not be affected by different measurements. However, in the embodiments presented above, the electrical conductivity of solid-state PEDOT:PSS (4083 and PH) and CPE-K was measured (in FIG. 7) by using planar diode structure. To fabricate the device, the active layer was deposited from the solutions of CPE (5 mg/mL in 1:1 H$_2$O:MeOH) on top of pre-cleaned glass substrates with spin-coating (spin speed=2500 revolutions per minute (rpm) for 2 minutes). The film thickness roughly amounts to 50 nm as determined by a profilometer. The Au parallel electrode bars (80 nm thick) were separated with a distance of 70 micrometers by thermal evaporation in a vacuum below 10$^{-7}$ Torr. The finished samples were transferred in a vacuum probe station and measured by a Keithley 4200 semiconductor parameter analyzer. The effective conduction channel depth is assumed to be 5 nm and electrical conductance was calculated from the slope of J-V characteristics using Ohm's law.

Higher concentrations and slower spin-rates will provide thicker films. The parameters (10 mg/mL, 800 rpm for 2 min) are used for conductivity and other measurements which require thicker films.

Experimental

Device Fabrication:

PTB7 and p-DTS(FBTTh$_2$)$_2$ were purchased from 1-Material Chemscitech Inc. (St-Laurent, Quebec, Canada) and used as received. Detailed synthesis of CPE-K was reported above. The device structure was ITO/PEDOT:PSS(or CPE-K)/donor:PC$_{71}$BM/(Ca)/Al. A thin layer (~30 nm thick) of PEDOT:PSS (Baytron PVP Al 4083) was spin-cast on top of pre-cleaned ITO substrates and annealed in air at 140° C. for 10 minutes (min). CPE-K was dissolved in a water/methanol mixture solvent. The fabrication of CPE-K was similar to that for PEDOT:PSS while the thickness was adjusted by varying the concentration of CPE-K solution from 20 mg/mL to 1 mg/mL. Then, active layers of PTB7:PC$_{71}$BM were cast from the solution with a PTB7:PC$_{71}$BM ratio of 1:1.5 (PTB7 concentration of 10 mg/mL in chlorobenzene/1,8-diiodoctane (97:3 vol %) mixture solvent at a spin-rate of 1000 revolutions per minute (rpm) for 2 min). The p-DTS(FBTTh$_2$)$_2$:PC$_{71}$BM (6:4 by weight, total concentration of 35 mg/mL) active layer was prepared by spin-coating the chlorobenzene solution with addition of 0.4 v % 1,8-diiodoctane (DIO) spun-cast at 1750 rpm for 90 seconds (s). The p-DTS(FBTTh$_2$)$_2$:PCBM (7:3 by weight, overall concentration of 40 mg/mL) active layer was prepared by spin-casting the chlorobenzene solution with 0.25 v % DIO at 2000 rpm for 40 s. After drying in vacuum, methanol treatment for PTB7:PC$_{71}$BM solar cells was carried out by spin-casting a methanol solvent on the top of active layers at 2500 rpm for 40 s. The devices were completed after deposition of a 100 nm thick Al or Ca (20 nm thick)/Al (100 nm thick) as cathodes (electrode area of 4.5 mm$^2$). Devices were encapsulated for testing in air with a UV-curable epoxy and covered with a glass slide.

Characterization and Measurement:

Current density-voltage (J-V) characteristics of the devices were measured by a Keithley 236 Source Measure Unit, and a Newport Air Mass 1.5 Global (AM 1.5G) full spectrum solar simulator with an irradiation intensity of 100 mW cm$^{-2}$. In all cases a circular aperture (3.98 mm$^2$) was used for obtaining the current-voltage curves. The 100 mW cm$^{-2}$ spectrum of incident light was spectrum and intensity matched with an Ocean Optics USB4000 spectrometer calibration standard lamp with NIST-traceable calibration from 350-1000 nm. External quantum efficiency (EQE) spectra were measured using a 75 W Xe lamp, Newport monochrometer, Newport optical chopper, and a Stanford Research Systems lock-in amplifier. Power-density calibration was done by National Institute of Standards and Technology traceable silicon photodiode.

The X-ray photoelectron spectroscopy (XPS) and UPS measurements were performed in a Kratos Ultra spectrometer (base pressure of 1×10$^9$ Torr) using monochromatized Al Kα X-ray photons (hv=1486.6 eV for XPS, h is Planck's constant, v is photon frequency) and a HeI (21.2 eV for UPS) discharge lamp. The capacitance-voltage measurement and the alternating current (AC) impedance measurements were conducted using an Agilent 4192A impedance analyzer. The AC impedance measurements were done in Z-θ mode with varying frequency (f) from 500 Hertz (Hz) to 1 Megahertz (MHz), and a fixed AC drive bias of 25 mV. A constant DC bias equal to the open-circuit voltage of the solar cell device was applied, superimposed on the AC bias. Conductive AFM measurements were carried out in an N$_2$-filled glovebox (<0.5 ppm O$_2$ and H$_2$O) using an Asylum MFP3D atomic force microscope (Oxford Instruments). All images were obtained using a single Au-coated silicon cantilever (Budget Sensors) with a tip diameter of 20 nm, a resonant frequency of 13 kHz, and a force constant of ~0.2 N/m.

Process Steps

Figure 16:
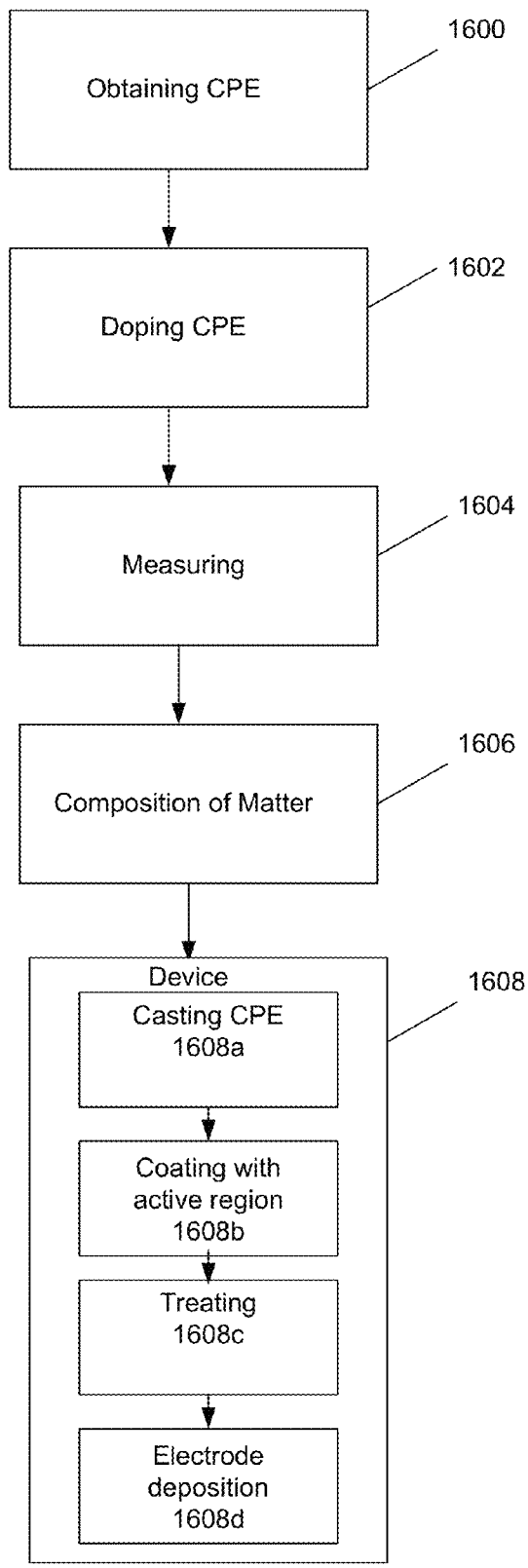
FIG. 16 is a flowchart illustrating a method of fabricating a doped CPE.

FIG. 16 illustrates a method of fabricating (or synthesizing) and doping one or more conjugated polyelectrolytes (CPEs), according to one or more embodiments (throughout this process steps section, the term "CPEs" is intended to include one or more conjugated polyelectrolytes).

Block 1600 represents obtaining or fabricating CPEs, or a composition of matter comprising the CPEs in a solvent, using synthesis conditions, each of the CPEs having a homopolymer or donor-acceptor copolymer backbone and one or more anionic side groups (or one or more hydrophilic and anionic side groups), the side groups attached to the backbone.

The step can include selecting the appropriate copolymer and side groups.

The CPEs can be soluble in a solvent (e.g., water or a protic solvent). In one embodiment, the CPEs are PCPDTBTSO$_3$K prepared as shown in FIG. 1(b) (see also [80]).

The copolymer can have an ionization potential and/or bandgap suitable for doping during dialysis (e.g., suitable for doping during dialysis in water). The copolymer can have an ionization potential below 5 eV; while there is no bound for the bandgap, typically, a copolymer with small ionization potential will also have small bandgap (<1.5 eV).

The copolymer can have a bandgap of no more than 2.14 eV and an ionization potential of no more than 4.92 eV, a bandgap of less than 2.44 eV and an ionization potential of less than 5.38 eV, or a bandgap of no more than 2.29 eV and an ionization potential of no more than 5.15 eV. The copolymer can comprise an electron-rich heterocycle which provides the copolymer with the ionization potential. The copolymer can comprise 5,6-dihydrocyclopenta[c]-1,2-dithiole-3(4H)-thione (CPDT), wherein the anionic side groups comprise sulfonate anionic side groups, for example.

Block 1602 represents obtaining the CPEs that are doped. The step can comprise doping (or means for doping) the CPEs, or providing conditions wherein the CPEs are doped or self doped (p-type doped).

The step can comprise protonating or oxidizing the copolymer backbone. The step can include providing a pH neutral or acidic condition wherein the copolymer backbone is p-type doped (e.g., by protonation or oxidiation).

The step/doping can comprise immersing, leaving, or sitting the one or more CPEs in a solvent (e.g., water or a protic solvent) or aqueous solution.

The step can comprise subjecting the composition of matter comprising CPEs, or CPEs in the solvent, to dialysis, wherein the CPEs are doped (p-type) after the dialysis. The step can comprise dissolving or placing the CPEs in a solvent (e.g., water or protic solvent), and performing dialysis, wherein the solvent and CPEs are separated from a second fluid by a dialysis membrane. The p-type doping can comprise the dialysis and action of the solvent. In one or more embodiments, dialysis removes the residue base in the polymer and the copolymer can be doped in neutral or acidic condition in the solvent by either protonation or oxidation.

Figure 17:
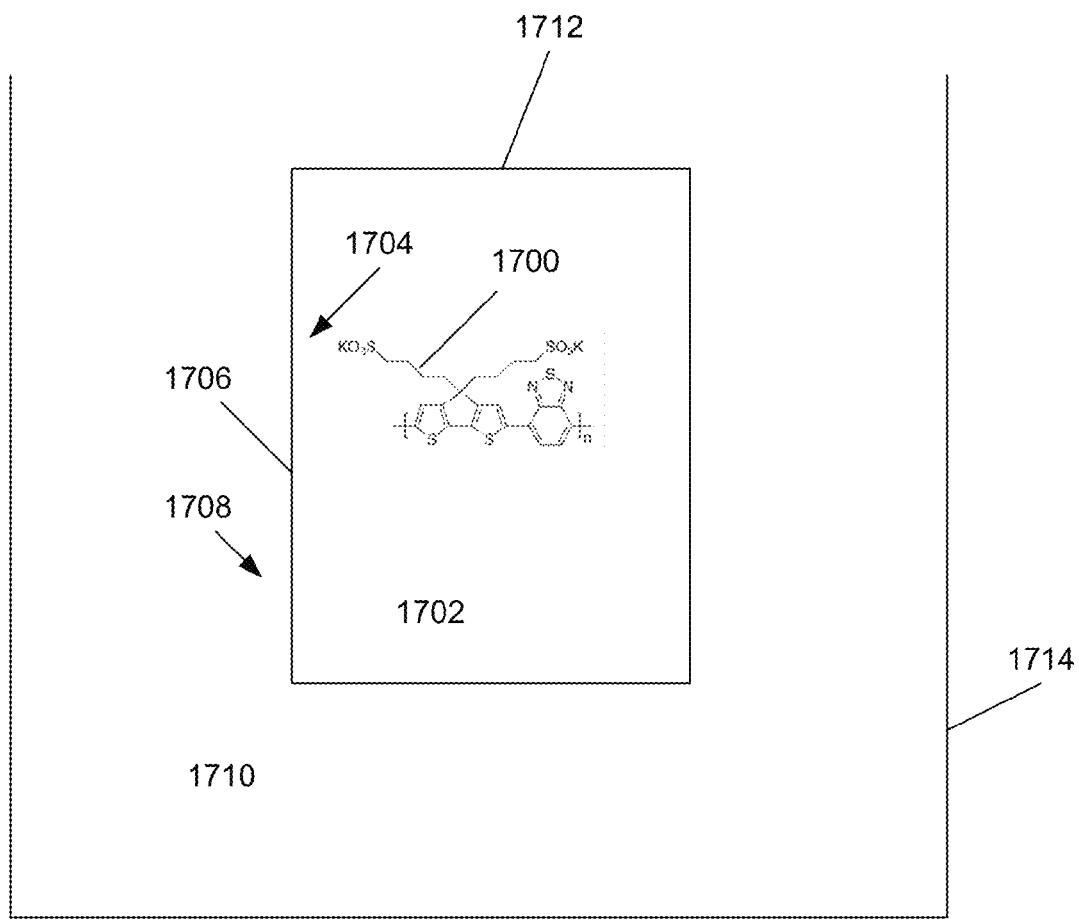
FIG. 17 is a cross-sectional schematic of an apparatus for performing dialysis to form a doped CPE.

FIG. 17 illustrates an embodiment of a set up that can be used for dialysis/diffusion to dope the one or more CPEs according to one or more embodiments. FIG. 17 illustrates one or more CPEs 1700 (e.g., PCPDTBTSO$_3$K), wherein at least some (or all) of the CPEs (e.g., as a precipitate) dissolved in a solvent 1702 and the CPEs 1700 and solvent 1702 are on a first side 1704 of a porous or semi-permeable membrane 1706. On a second side 1708 of the membrane 1706 is a second fluid 1710 (e.g. the second fluid can be a solvent in which CPEs 1700 dissolve; the second fluid 1710 can be the same as solvent 1702). The membrane 1706 selectively allows some of the components of the solution (comprising the CPEs 1700 and solvent 1702) to transfer (e.g., diffuse) across the membrane 1706 into the second fluid 1710, while hindering or preventing the passage of other components. For example, the components that are sufficiently small to pass through pores in the membrane 1706, and/or components having a molecular weight smaller than a molecular weight cut off of the membrane 1706, can diffuse through the membrane into the second fluid 1710. The second fluid 1710 can be periodically or continuously replaced with fresh second fluid 1710. The membrane 1706 can form a tube or porous container 1712, the solvent 1702 and CPEs 1700 can be transferred/placed in the tube 1712 (e.g., dialysis tube) having the membrane 1706 (e.g., dialysis membrane), and the tube 1712, porously enclosing/surrounding the solvent 1702 and CPEs 1700, can be immersed in the second fluid 1710. The second fluid 1710 can comprise a quantity (e.g., 2 liters) of water (H$_2$O) contained in a beaker 1714, the solvent 1702 can comprise a quantity (e.g. 25 milliliters) of millipore H$_2$O, and dialysis can occur or be performed via the dialysis membrane 1706 (having a molecular weight cut off of 3500-5000 Da) for a period of time (e.g., 3 days), while stirring the H$_2$O 1710 and changing the H$_2$O 1710 after one or more periods of time (e.g., periodically, e.g., every 12 hours). The solvent 1702 can comprise water or a protic solvent. After sufficient diffusion/dialysis time, the CPEs 1700 remaining in the tube 1712 (or on the first side 1704 of the membrane 1706) are removed and used for analysis in Block 1604, provides the composition of Block 1606, and/or is used to fabricate a device (Block 1608).

The CPEs can have low molecular weight (MW), about 8-10 repeating units with a polydispersity index (PDI) of 1.05. This indicates that molecular weight can be solubility-limited during the synthesis. In one or more embodiments, during dialysis, only very very small amount, if any, of low MW CPE are diffused out of the dialysis tube. In other embodiments, CPEs with excess counterions can pass through the dialysis membrane.

The CPEs can be fabricated under synthesis conditions that produce excess ions (K$_2$CO$_3$) that inhibit the doping, and the method can comprise means (e.g., dialysis) to remove the excess ions and means (e.g., dialysis) to drive the doping forward.

According to one or more embodiments of the invention, any anionic CPE with low ionization potential (<5 eV) should be able to be doped during dialysis in water. While one or more embodiments describe anionic CPEs with cyclopentadithiophene monomer units can be doped during dialysis, the present invention can be extended to a wide range of CPEs.

Block 1604 represents the optional step of measuring or characterizing the doping or conductivity of the CPEs.

Block 1606 represents the composition of matter fabricated according the method, one or more self-doped CPEs or a polymer structure comprising a homopolymer or donor-acceptor copolymer backbone and one or more anionic side groups (or one or more hydrophilic side groups and one or more anionic side groups), the side groups attached (e.g., covalently) to the backbone.

The CPEs fabricated according to one or more embodiments can be self doped, wherein a self-doped conducting polymer can be described as a conjugated polymer where a significant fraction of monomer units contained a covalently attached ionizable, negatively charged, functional group acting as a stable/immobile dopant anion [18].

A composition of matter consisting essentially of one or more of the CPEs can be doped (e.g., p-type doped). For example, if the one or more CPEs are removed from the solvent (e.g., acidic, water, or protic solvent), the one or more CPEs can remain doped (p-type doped) with the measured conductivity.

The doping can provide the doped (e.g., p-type doped) CPEs (or film comprising the p-type doped CPEs) having a pH greater than 4, pH greater than 5, pH greater than 6, pH that is neutral (~7), pH between 6-8.5, pH between 7-9, or pH between 6.5 and 8. The doping can provide the p-type doped CPEs in a solvent/solution/environment having a pH greater than 4, pH greater than 5, pH greater than 6, or pH that is neutral (~7), pH between 6-8.5, pH between 7-9, or pH between 6.5 and 8.

The doped CPEs can comprise cationic polarons and/or be pH neutral or close to neutral (e.g., the CPE aqueous solution can have a pH close to neutral, e.g., pH~7). For example, the pH of 1 mg/mL of CPE-K in water was measured by pH meter to be 7.56.

The CPE synthesis conditions and/or doping can allow formation of cationic polarons on the copolymer backbone wherein the anionic groups stabilize or increase stability of the cationic polarons by coulombic stabilization.

A film (e.g., solution processed) deposited from a solution comprising the doped CPEs, or one or more of the p-type doped CPEs, can have an electrical conductivity (p-type or hole electrical conductivity) of at least $\sigma=1.5\times10^{-3}$ S/cm, at least $\sigma=2\times10^{-4}$ S/cm, $\sigma=1.5\times10^{-3}$ S/cm or more, $\sigma=2\times10^{-4}$ S/cm or more, up to or at least $\sigma=0.2$ S/cm (achieved for a derivative having the formula CPE-C3-Na), or in a range of $1.5\times10^{-3}$ S/cm–0.2 S/cm. One or more of the CPEs can be doped (e.g., self doped) via the dialysis such that the electrical conductivity has those values.

The stability of the CPEs was also quantified by measuring the conductivity of CPE-K films. In one or more embodiments, after placing the CPE-K films in an air atmosphere, no significant change in conductivity was found after at least three months.

The CPE can be PCPDTBTSO$_3$—C with a poly[2,6-(4,4-bis-Cbutanylsulfonate-4H-cyclopenta-[2,1-b;3,4-b']dithiophene)-alt-4,7-(2,1,3-benzothiadiazole)] donor-acceptor backbone, where C is a counterion or countercation. C can be a counterion or countercation such that the doped CPE is soluble in a pH neutral solvent used during solution processing in a device.

The doped CPE can be PCPDTBTSO$_3$—K with a poly[2,6-(4,4-bis-potassiumbutanylsulfonate-4H-cyclopenta-[2,1-b;3,4-b']-dithiophene)-alt-4,7-(2,1,3-benzothiadiazole)] donor acceptor backbone.

The counterions or countercations in the doped CPEs can be selected or exchanged to achieve a desired solubility in the solvent or a solution used during solution processing in a device comprising the CPEs, wherein the counterions or countercations are charge compensating counterions or countercations. The countercation can be Potassium (K), tetrabutylammonium (TBA), or Sodium (Na), for example. The doped CPEs can be soluble in water (e.g., the countercation can achieve solubility for the doped CPEs in a solution comprising water).

The CPEs can be water soluble up to 20 mg/mL at room temperature.

Parameters such as the CPE composition (including backbone, side group, and counterion composition), solvent composition, dialysis conditions (e.g., duration of the dialysis (e.g., 3 days), periodicity of changing the second fluid 1710, and dialysis membrane structure (e.g., pore size)) can be selected to obtain the desired doping levels/conductivity for the CPEs. The doping can be monitored at during/at various stages of the dialysis to determine if sufficient doping is obtained. For example, the parameters can be selected such that the dialysis increases the doping of the CPEs, e.g., to a level characterized by an increase in absorbance (of electromagnetic radiation at 1150 nm wavelength) by a factor of, e.g., at least 8 or at least 11 (see FIG. 2(b)) as compared to without the dialysis. For example, the parameters can be selected such that the dialysis increases the doping of the CPEs to a level such that at addition of at least 10 equiv of a base (e.g., KOH) is required to reduce the absorbance at 1150 nm to below 0.02. For example, the parameters can be selected such that the dialysis increases the doping of the CPEs to a level such that at addition of at least 10 equiv of a base (e.g., KOH) is required to reduce the CPE conductivity (or a film's conductivity, the film comprising the CPEs) to below $10^{-12}$ S/cm, or reduce the conductivity by a factor of $10^8$. For example, the parameters can be selected such that the dialysis increases the doping of the CPEs to a level such that at addition of at least 10 equiv of a base (e.g., KOH) is required to reduce the EPR peak by a factor of at least 5.

Block 1608 represents the optional step of fabricating the doped CPEs in a device (e.g. organic optoelectronic or electronic device). For example, the p-type doped CPEs can be fabricated (e.g., incorporated) as an HTL or anode buffer layer in a solar cell. The doped CPEs can be soluble for solution processing and casting into the device.

The pH neutral property of the CPEs can prevent corrosion of ITO (Indium Tin Oxide) when the CPEs are placed on Indium Tin Oxide (ITO), e.g, when the CPEs are incorporated as an HTL.

The fabricating can comprise solution processing and casting (Block 1608a) the doped CPEs on a substrate; coating (Block 1608b) the (p-type) doped CPEs with a bulk heterojunction polymer active region; treating the active region (Block 1608c); and depositing a cathode electrode (Block 1608d) on the active region, wherein the film comprising the doped CPEs has a thickness and homogenous conductivity such that the solar cell has, or includes, a power conversion efficiency (PCE) of at least 6.2% (e.g., 6.2% to 8.2%), a short circuit current density $J_{sc}$ of at least 13.5 mA/cm$^{-2}$ (e.g., 13.5-16.32 mA/cm$^{-2}$), an open circuit voltage $V_{oc}$ of no less than 0.69 V, and a Fill Factor FF of at least 0.66, under AM 1.5 G irradiation. The PCE is measured using output power $(P_{out})$/input power $(P_{in})\times100=J_{sc}V_{oc}FF/$ (incident light intensity×device area)×100. At incident electromagnetic radiation wavelengths between 350 nanometers (nm) and 700 nm, an incident photon conversion efficiency (IPCE) or External Quantum Efficiency (EQE) of the CPE HTL can be over 70% or 75%, and the solar cell's $J_{sc}$ can be at least 16.32 mA/cm$^{-2}$, wherein the EQE or IPCE is measured as [current/(charge of 1 electron)]/[(total power of photons incident)/(energy of one photon)].

The HTL comprising the doped CPEs can have a root mean square (RMS) surface roughness of no more than 0.74 nm over an area of at least 5 micrometers by 5 micrometers.

The device can comprise a BHJ active region (e.g., polymer:fullerene bulk heterojunction active region comprising thieno[3,4-b]-thiophene/benzodithiophene donor and [6,6]-phenyl C71-butyric acid methyl ester (PC$_{71}$BM) acceptor); a cathode on the active region; and the HTL on an (e.g., ITO/glass) substrate and between the active region and the substrate.

Doping Mechanism

While the doping mechanism is still not clear, some possible explanations can be provided (without being bound by any particular scientific theory).

Figure 18A:
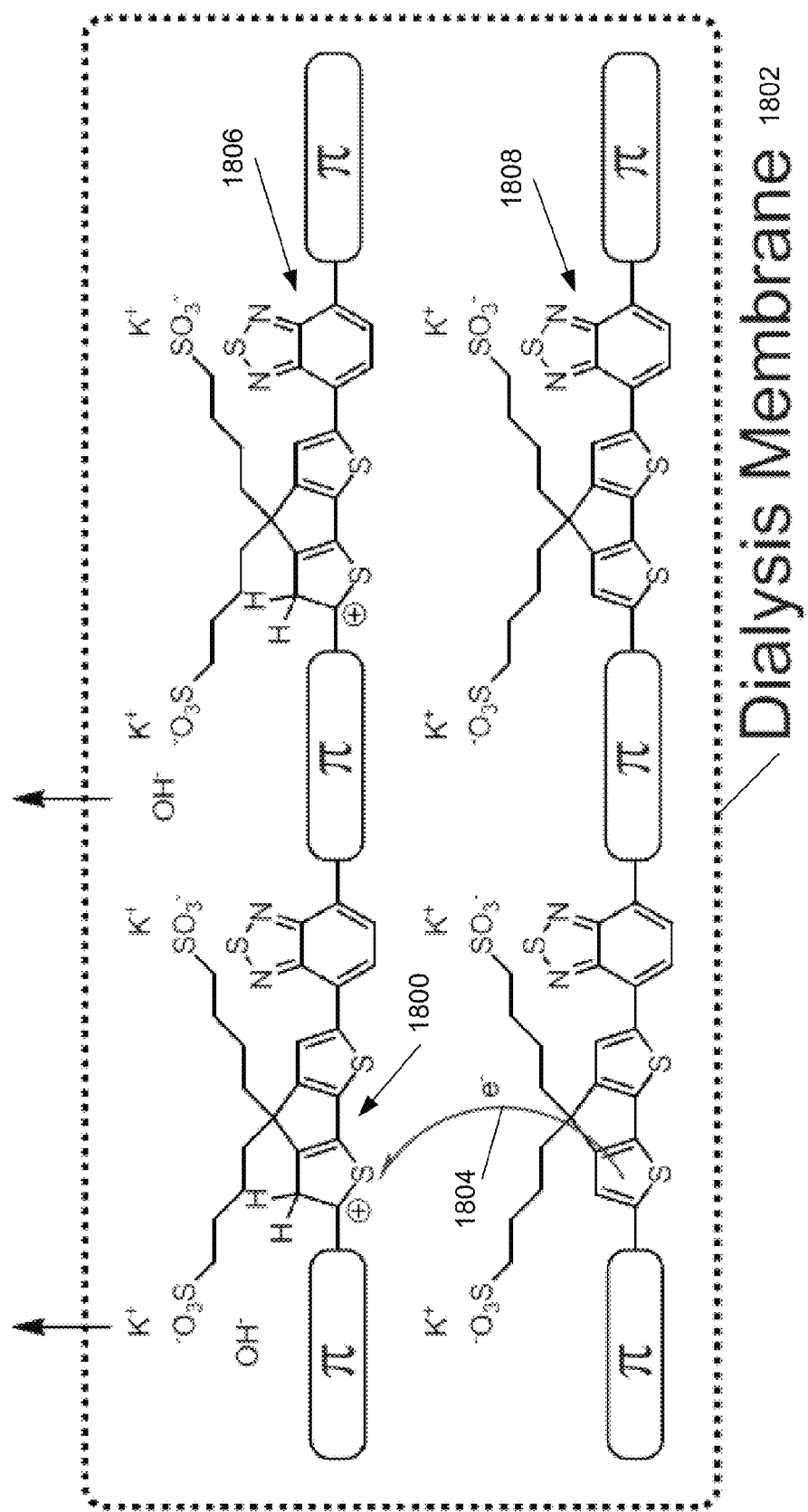
FIG. 18(a) and FIG. 18(b) illustrate a possible doping mechanism, comprising 1) protonation of the polymer backbone to generate dication, with continuous diffusion of K+ and OH− out of the dialysis tube, and 2) comproportionation of the dicationic polymer chain with a non-protonated one generates two chains with radical cations.
Figure 18B:
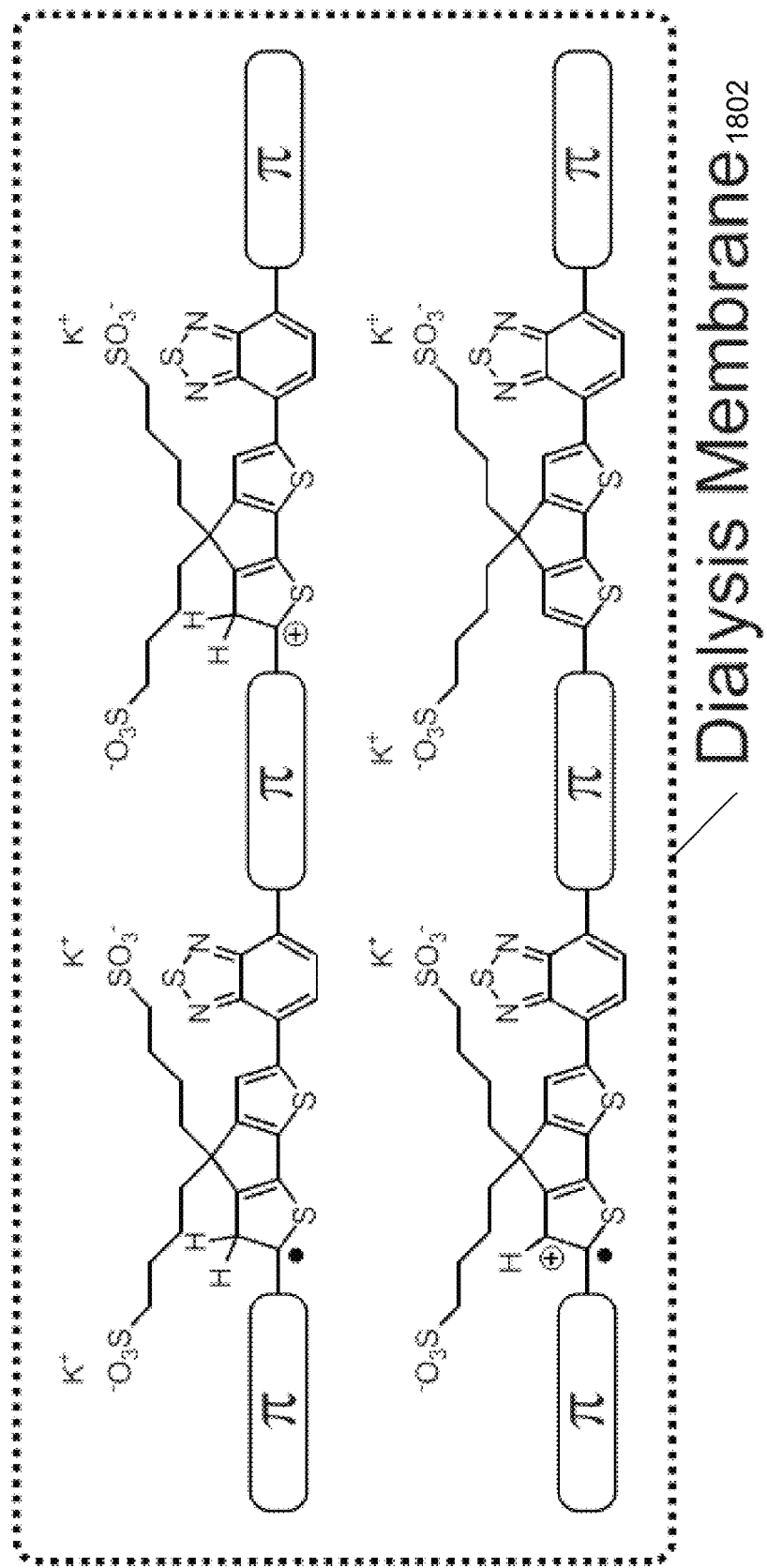

One possible doping mechanism is that the electron-rich CPE backbone is protonated by water to induce charge transfer from another CPE to generate radical cations on both CPEs [29]. A detailed mechanism is provided in the schemes illustrated in FIG. 18(a) and FIG. 18(b). The mechanism includes 1) protonation of the polymer backbone 1800 to generate a dication and a positive charge ⊕, with continuous diffusion of $K^+$ and $OH^-$ out of the dialysis tube through the dialysis membrane 1802; and 2) comproportionation (via electron transfer $e^-$ indicated with the arrow 1804) of the dicationic polymer chain 1806 with a non-protonated one 1808, generating two chains 1806, 1808 with radical cations and positive charge ⊕. Also illustrated in FIG. 18 are the pi bonds (π) of the polymer chains.

The other doping mechanism is simple oxidation of the CPE backbone.

Both mechanisms are facilitated by electrostatic stabilization of the pendant anionic side chains and the positive charged polarons generated on the conjugated backbone.

In one or more embodiments, the copolymer can be doped in neutral or acidic condition by either protonation or oxidation.

However, in one or more embodiments, dialysis is necessary for the doping process. After synthesis according to one or more embodiments, there can be excess base (e.g., $K_2CO_3$ in the case of CPE-K) left over (residue base in the polymer), which inhibits the doping. Upon self-doping wherein positive polarons/positive charges are formed on the CPE conjugated backbone, the excess counterions need to be expelled out of the CPE to maintain charge balance (the CPE is charge balanced). The process of expelling counterions is facilitated by dialysis, wherein the dialysis may remove the excess counterions (e.g., $K^+$ diffuse out of the tube, for example, as in the mechanism illustrated in FIG. 18(a)).

Typically, absorption of a CPE with larger molecular weight is more red-shifted than absorption of a CPE of smaller molecular weight, if the conjugated length has not been saturated. In one or more embodiments, larger molecular weight CPEs are preferred and selected, because they seem to have lower oxidation potential, thus more easily doped.

FIG. 18 further illustrates a composition of matter, comprising (a) a CPE comprising a backbone 1800 and positive charge ⊕ on the backbone 1800; (b) means (e.g., anionic side groups ($K^+SO_3^-$) or statutory equivalents thereof) to retain or resist removal of the positive charge ⊕ on the backbone 1800 and increase stability of the doping, wherein the CPE is doped (e.g., p-type doped) and can be pH neutral.

Advantages and Improvements

The $PCPDTBTSO_3K$ can have conductive behavior similar to or better than those of other doped conjugated polymers. The general solubility characteristics can be modified by the charge compensating counterions. When doped, the acidity is low. The conductivity and ability to incorporate into devices of $PCPDTBTSO_3K$ is similar to or better than that of PEDOT:PSS.

Possible Modifications, Variations and Other Examples

Copolymers can be selected for the CPE because it is easy to tune the energy level and band gap. As indicated above, anionic pendant groups are the key for the formation of positive polaron on the conjugated backbone due to the electrostatic stabilization.

Any CPE with lower oxidation potential should be able to be doped via dialysis. CPEs with electron-rich monomer units possess lower oxidation potential. The more electron rich, the lower the oxidation potential is.

Figure 19A:
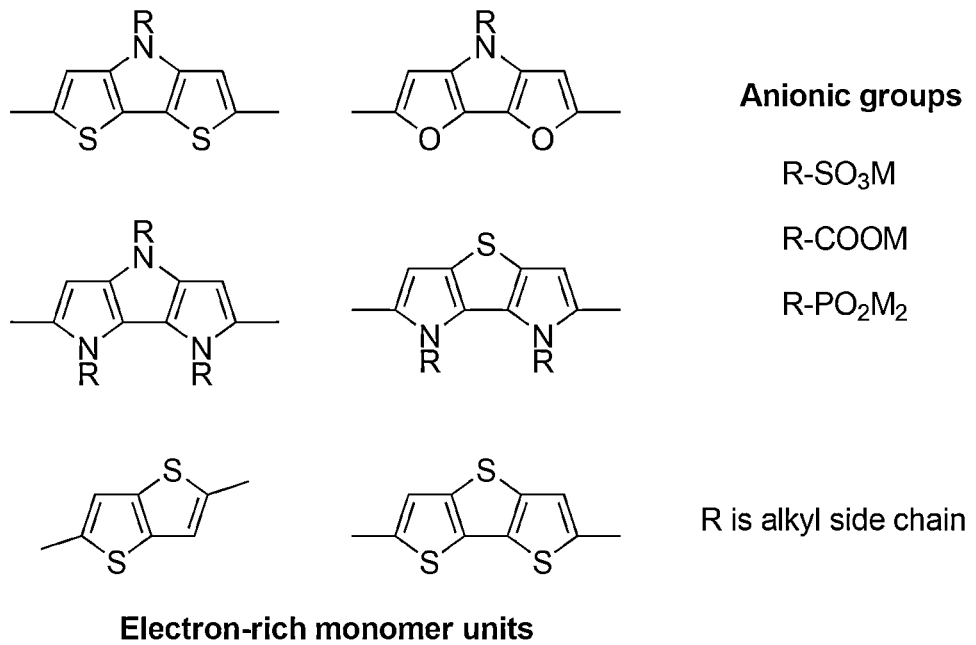
FIG. 19(a) illustrates some examples of electron-rich monomer units and anionic groups (including carboxylate and phosphate groups) that could be used to fabricate CPEs according to one or more embodiments of the invention, where M is an element or compound.

Organic synthesis can provide a wide range of combination of polymers based on building blocks. For example, CPEs with facile doping via dialysis can be prepared from the electron-rich monomer units with pendant anionic side chains or side groups (including carboxylate and phosphate groups) illustrated in FIG. 19(a).

Figure 19B:
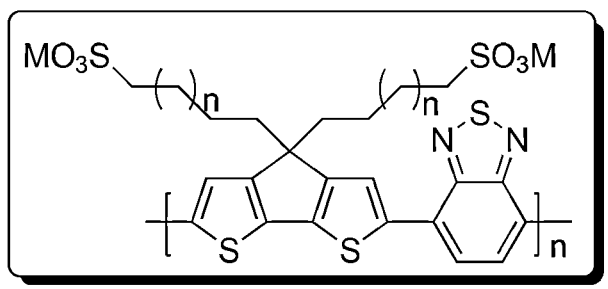
FIG. 19(b) illustrates CPEs that have been studied in one or more embodiments of the invention.

FIG. 19(b) illustrates CPEs that have been studied in one or more embodiments of the invention. CPE-C3-Na (Na counterions and short alky side chains) obtained a conductivity up to at least σ=0.2 S/cm, measured by four-point probe measurements.

Design and synthesis of related materials of different chemical structures can tune physical properties for broader application in electronic devices such as organic solar cells, organic light emitting diodes, organic thin film transistors, and organic thermoelectrics.

For example, one or more embodiments of the invention can achieve a buffer layer with higher ionization potential and wider bandgap. As discussed above, $PFBTSO_3Na$ is provided as a negative example. However, one or more embodiments of the present invention can fabricate doped CPEs with any ionization potential and bandgap less than that of PFBTSO3Na (5.38 eV, 2.44 eV). For example, the copolymer can have a bandgap of less than 2.44 eV and an ionization potential of less than 5.38 eV. For example, the copolymer can have a bandgap of no more than 2.29 eV and an ionization potential of no more than 5.15 eV (wherein the middle numbers between PFBTSO3Na and PCPDTPhSO3Na are used).

FIG. 20 illustrates an organic transistor structure, according to one or more embodiments, comprising a substrate 2000, a gate G on or above the substrate, a dielectric layer 2002 on the Gate G, an active layer 2004 (comprising the doped CPE) on or above the dielectric layer 2002, and source S and drain D contacts contacting the active layer 2004.

FIG. 21 illustrates an optoelectronic device, an organic light emitting diode (OLED), a substrate 2100, a transparent conductive layer 2102 (e.g., ITO) on, above, or overlying the substrate 2100 (e.g., glass, plastic), a p-type hole interface/transport layer 2104 on, above, or overlying the transparent conductive layer 2102, the active or emission layer 2106 on, above, or overlying the p-type hole transport layer 2104, an n-type electron interface/transport layer 2108 on, above, or overlying the active layer 2106, and a metal contact 2110 to the n-type transport layer 2108. The n-type and/or p-type transport layers can comprise the doped CPE according to one or more embodiments of the invention.

REFERENCES

The following references are incorporated by reference herein.

[1] A. O. Patil, Y. Ikenoue, F. Wudl, A. J. Heeger, J. Am. Chem. Soc. 1987, 109, 1858-1859.
[2] Conjugated Polyelectrolytes Fundamentals and Applications (Eds: B. Liu, G. C. Bazan) Wiley-VCH GmbH & Co, Weinheim, 2013.
[3] M. R. Pinto, K. S. Schanze, Synthesis 2002, 2002, 1293-1309.
[4] C. V. Hoven, A. Garcia, G. C. Bazan, T.-Q. Nguyen, Adv. Mater. 2008, 20, 3793-3810.

[5] K. S. Schanze, A. H. Shelton, Langmuir 2009, 25, 13698-13702.
[6] H. Jiang, P. Taranekar, J. R. Reynolds, K. S. Schanze, Angew. Chem., Int. Ed. 2009, 48, 4300-4316.
[7] F. Huang, H. Wu, Y. Cao, Chem. Soc. Rev. 2010, 39, 2500-2521.
[8] A. Duarte, K.-Y. Pu, B. Liu, G. C. Bazan, Chem. Mater. 2011, 23, 501-515.
[9] J. Luo, H. Wu, C. He, A. Li, W. Yang, Y. Cao, Appl. Phys. Lett. 2009, 95, 43301-43303.
[10] J. H. Seo, A. Gutacker, Y. Sun, H. Wu, F. Huang, Y. Cao, U. Scherf, A. J. Heeger, G. C. Bazan, J. Am. Chem. Soc. 2011, 133, 8416-8419.
[11] A. Kumar, G. Pace, A. A. Bakulin, J. Fang, P. K. H. Ho, W. T. S. Huck, R. H. Friend, N. C Greenham, Energy Environ. Sci. 2013, 6, 1589-1596
[12] C. Duan, K. Zhang, X. Guan, C. Zhong, H. Xie, F. Huang, J. Chen, J. Peng, Y. Cao, Chem. Sci. 2013, 4, 1298-1307.
[13] C. V. Hoven, R. Yang, Garcia, V. Crockett, A. J. Heeger, G. C. Bazan, T.-Q. Nguyen, Proc. Natl. Acad. Sci. U.S.A. 2008, 105, 12730-12735.
[14] J. Fang, B. H. Wallikewitz, F. Gao, G. Tu, C. Müller, G. Pace, R. H. Friend, W. T. S. Huck, J. Am. Chem. Soc. 2011, 133, 683-685.
[15] J. H. Seo, A. Gutacker, B. Walker, S. Cho, A. Garcia, R. Yang, T.-Q. Nguyen, A. J. Heeger, G. C. Bazan, J. Am. Chem. Soc. 2009, 131, 18220-18221.
[16] J. H. Seo, E. B. Namdas, A. Gutacker, A. J. Heeger, G. C. Bazan, Adv. Funct. Mater. 2011, 21, 3667-3672.
[17] Z. B. Henson, Y. Zhang, T.-Q. Nguyen, J. H. Seo, G. C. Bazan, J. Am. Chem. Soc. 2013, 135, 4163-4166.
[18] Self-Doped Conducting Polymers, M. S. Freund, B. A. Deore, John Wiley & Sons Ltd, England, 2007.
[19] F. Huang, X. Wang, D. Wang, W. Yang, Y. Cao, Polymer 2005, 46, 12010-12015.
[20] R. Yang, A. Garcia, D. Korystov, A. Mikhailovsky, G. C. Bazan, T. Q. Nguyen, J. Am. Chem. Soc. 2006, 128, 16532-16539.
[21] G. Zotti, S. Zecchin, G. Schiavon, Chem. Mater. 1997, 4756, 2940-2944.
[22] D. Mühlbacher, M. Scharber, M. Morana, Z. Zhu, D. Waller, R. Gaudiana, C. Brabec, Adv. Mater. 2006, 18, 2884-2889.
[23] C. Soci, I.-W. Hwang, D. Moses, Z. Zhu, D. Waller, R. Gaudiana, C. J. Brabec, A. J. Heeger, Adv. Funct. Mater. 2007, 17, 632-636
[24] Z. W. Sun, A. J. Frank, J. Chem. Phys. 1991, 94, 4600-4608.
[25] A. O. Patil, Y. Ikenoue, N. Basescu, N. Colaneri, J. Chen, F. Wudl, A. J. Heeger, Synth. Met. 1987, 20, 151-159.
[26] Y. Ikenoue, N. Outani, A. O. Patil, F. Wudl, A. J. Heeger, Synth. Met. 1989, 30, 305-319.
[27] Y. Ikenoue, Y. Saida, M.-A. Kira, H. Tomozawa, H. Yashima, M. Kobayashi, J. Chem. Soc., Chem. Comm. 1990, 1694-1695.
[28] S. A. Chen, M. Y. Hua, Macromolecules 1993, 26, 7108-7110; d) M. Chayer, K. Faïd, M. Leclerc, Chem. Mater. 1997, 9, 2902-2905.
[29] C. C. Han, R. L. Elsenbaumer, Synth. Met. 1989, 30, 123-131.
[30] C. C. Han, R. L. Elsenbaumer, U.S. Pat. No. 5,185,100, 1993.
[31] W. Zhang, S. Dong, Electrochim. Acta 1993, 38, 441-445.
[32] J. Joo, H. Song, Y. Chung, J. Korean Phys. Soc. 1997, 30, 230-236; c) J. Romanova, G. Madjarova, Int. J. Quant. Chem. 2011, 111, 435-443.
[33] T. Abdiryim, C. Zhao, R. Jamal, A. Ubul, W. Shi, I. Nurulla, Polym. Sci. Ser. B 2012, 54, 413-419.
[34] C. McCallum, A. D. Pethybridge, Electrochem. Acta, 1975, 20, 815-818.
[35] Guthrie, J. P. Can. J. Chem. 1978, 56, 2342-2354.
[36] Y. Jin, R. Yang, H. Suh, H. Y. Woo, Macromol. Rapid Commun. 2008, 29, 1398-1402.
[37] Z. Li, X. Zhang, G. Lu, T.-Q. Nguyen, J. Phys. Chem. C 2012, 116, 1205-1210.
[38] B. A. D. Neto, A. A. M. Lapis, E. N. da Silva Júnior, J. Dupont, Eur. J. Org. Chem. 2013, 228-255.
[39] R. Abbel, A. P. H. J. Schenning, E. W. Meijer, J. Polym. Sci. A Polym. Chem. 2009, 47, 4215-4233.
[40] H. Shirakawa, E. J. Louis, A. G. MacDiarmid, C. K. Chiang, A. J. Heeger, J. Chem. Soc., Chem. Comm. 1977, 578-580.
[41] A. Elschner, S. Kirchmeyer, W. Lovenich, U. Merker, K. Reuter, PEDOT: Principles and Applications of an Intrinsically Conductive Polymer. Taylor and Francis Group, LLC, US 2011.
[42] H.-L. Yip, A. K.-Y. Jen, Energy Environ. Sci. 2012, 5, 5994-6011.
[43] G. Yu, J. Gao, J. C. Hummelen, F. Wudl, A. J. Heeger, Science 1995, 270, 1789.
[44] C. J. Brabec, S. Gowrisanker, J. J. M. Halls, D. Laird, S. J. Jia, S. P. Williams, Adv. Mater. 2010, 22, 3839.
[45] B. C. Thompson, J. M. J. Frechet, Angew. Chem. Int. Edit. 2008, 47, 58.
[46] B. Carsten, F. He, H. J. Son, T. Xu, L. P. Yu, Chem. Rev. 2011, 111, 1493.
[47] S. H. Park, A. Roy, S. Beaupre, S. Cho, N. Coates, J. S. Moon, D. Moses, M. Leclerc, K. Lee, A. J. Heeger, Nat. Photonics. 2009, 3, 297. [48] T. S. van der Poll, J. A. Love, T. Q. Nguyen, G. C. Bazan, Adv. Mater. 2012, 24, 3646.
[49] Y. M. Sun, G. C. Welch, W. L. Leong, C. J. Takacs, G. C. Bazan, A. J. Heeger, Nat. Mater. 2012, 11, 44.
[50] J. Peet, J. Y. Kim, N. E. Coates, W. L. Ma, D. Moses, A. J. Heeger, G. C. Bazan, Nat. Mater. 2007, 6, 497.
[51] J. Jo, S. I. Na, S. S. Kim, T. W. Lee, Y. Chung, S. J. Kang, D. Vak, D. Y. Kim, Adv. Funct. Mater. 2009, 19, 2398.
[52] H. L. Yip, A. K. Y. Jen, Energ. Environ. Sci. 2012, 5, 5994.
[53] L. M. Chen, Z. Xu, Z. R. Hong, Y. Yang, J. Mater. Chem. 2010, 20, 2575.
[54] A. M. Nardes, M. Kemerink, R. A. J. Janssen, Phys. Rev. B. 2007, 76.
[55] L. S. C. Pingree, B. A. MacLeod, D. S. Ginger, J. Phys. Chem. C. 2008, 112, 7922.
[56] A. M. Nardes, M. Kemerink, R. A. J. Janssen, J. A. M. Bastiaansen, N. M. M. Kiggen, B. M. W. Langeveld, A. J. J. M. van Breemen, M. M. de Kok, Adv. Mater. 2007, 19, 1196.
[57] C. Ionescu-Zanetti, A. Mechler, S. A. Carter, R. Lal, Adv. Mater. 2004, 16, 579.
[58] M. P. de Jong, L. J. van Jzendoorn, M. J. A. de Voigt, Appl. Phys. Lett. 2000, 77, 2255.
[59] K. W. Wong, H. L. Yip, Y. Luo, K. Y. Wong, W. M. Lau, K. H. Low, H. F. Chow, Z. Q. Gao, W. L. Yeung, C. C. Chang, Appl. Phys. Lett. 2002, 80, 2788.
[60] J. E. Yoo, K. S. Lee, A. Garcia, J. Tarver, E. D. Gomez, K. Baldwin, Y. M. Sun, H. Meng, T. Q. Nguyen, Y. L. Loo, PNAS 2010, 107, 5712.

[61] M. D. Irwin, B. Buchholz, A. W. Hains, R. P. H. Chang, T. J. Marks, *PNAS* 2008, 105, 2783.
[62] A. Garcia, G. C. Welch, E. L. Ratcliff, D. S. Ginley, G. C. Bazan, D. C. Olson, *Adv. Mater.* 2012, 24, 5368.
[63] C. Y. Li, T. C. Wen, T. F. Guo, *J. Mater. Chem.* 2008, 18, 4478.
[64] A. W. Hains, J. Liu, A. B. F. Martinson, M. D. Irwin, T. J. Marks, *Adv. Funct. Mater.* 2010, 20, 595.
[65] S. S. Li, K. H. Tu, C. C. Lin, C. W. Chen, M. Chhowalla, *Acs Nano* 2010, 4, 3169.
[66] Z. Tang, L. M. Andersson, Z. George, K. Vandewal, K. Tvingstedt, P. Heriksson, R. Kroon, M. R. Andersson, O. Inganas, *Adv. Mater.* 2012, 24, 554.
[67] Z. C. He, C. M. Zhong, X. Huang, W. Y. Wong, H. B. Wu, L. W. Chen, S. J. Su, Y. Cao, *Adv. Mater.* 2011, 23, 4636.
[68] J. H. Seo, A. Gutacker, Y. M. Sun, H. B. Wu, F. Huang, Y. Cao, U. Scherf, A. J. Heeger, G. C. Bazan, *J. Am. Chem. Soc.* 2011, 133, 8416.
[69] Y.-M. Chang, R. Zhu, E. Richard, C.-C. Chen, G. Li, Y. Yang, *Adv. Funct. Mater.* 2012, 22, 3284.
[70] Z. He, C. Zhong, S. Su, M. Xu, H. Wu, Y. Cao, *Nat. Photonics.* 2012, 6, 593.
[71] J. H. Seo, R. Q. Yang, J. Z. Brzezinski, B. Walker, G. C. Bazan, T. Q. Nguyen, *Adv. Mater.* 2009, 21, 1006.
[72] C. V. Hoven, *PhD Dissertation* 2010, University of California.
[73] Y. Ikenoue, N. Uotani, A. O. Patil, F. Wudl, A. J. Heeger, *Synth. Met.* 1989, 30, 305.
[74] E. E. Havinga, L. W. Vanhorssen, W. Tenhoeve, H. Wynberg, E. W. Meijer, *Polym. Bull.* 1987, 18, 277.
[75] C.-K. Mai, H. Q. Zhou, Y. Zhang, Z. B. Henson, T.-Q. Nguyen, A. J. Heeger, G. C. Bazan, *Submitted to Angew. Chem. Int. Edit.*
[76] H. Q. Zhou, Y. Zhang, J. Seifter, S. D. Collins, C. Luo, G. C. Bazan, T. Q. Nguyen, A. J. Heeger, *Adv. Mater.* 2013, 25, 1646.
[77] D. J. D. Moet, P. de Bruyn, P. W. M. Blom, *Appl. Phys. Lett.* 2010, 96, 153504.
[78] J. C. Bijleveld, R. A. M. Verstrijden, M. M. Wienk, R. A. J. Janssen, *Appl. Phys. Lett.* 2010, 97.
[79] X. D. Dang, M. Dante, T. Q. Nguyen, *Appl. Phys. Lett.* 2008, 93, 241911.
[80] Facile Doping of Anionic Narrow Band Gap Conjugated Polyelectrolytes During Dialysis, by Cheng-Kang Mai, Huiqiong Zhou, Yuan Zhang, Zachary B. Henson, Thuc-Quyen Nguyen, Alan J. Heeger, and Guillermo C. Bazan, Angewandte Chemie International Edition, Volume 52, Issue 49, pages 12874-12878, Dec. 2, 2013.
[81] Conductive Conjugated Polyelectrolyte as Hole-transporting Layer for Organic Bulk Heterojunction Solar Cells, by Huiqiong Zhou, Yuan Zhang, Cheng-kang Mai, Samuel D. Collins, Thuc-Quyen Nguyen, Guillermo C. Bazan, and Alan J. Heeger, Advanced Materials, Volume 26, Issue 5, pages 780-785, Feb. 5, 2014.
[82] http://www.heraeusclevios.com/media/webmedia_local/media/datenblaetter/8107 5812_CLEVIOS_P_VP_AI_4083_20101222.pdf

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating, including p-type doping, a composition of matter, comprising:
    obtaining a composition of matter comprising the one or more conjugated polyelectrolytes immersed in at least one solvent selected from water, an acidic solvent, and a protic solvent, each conjugated polyelectrolyte comprising a donor-acceptor copolymer backbone and one or more anionic side groups; and
    subjecting the composition of matter to dialysis wherein the conjugated polyelectrolytes are p-type doped after the dialysis;
    wherein the one or more conjugated polyelectrolytes are self doped and the copolymer backbone is protonated.

2. The method of claim 1, wherein the conjugated polyelectrolytes are pH neutral.

3. The method of claim 1, wherein a film, deposited from a solution comprising the conjugated polyelectrolytes, provides p-type charge transport and has an electrical conductivity of at least $\sigma=1.5\times10^{-3}$ Siemens per centimeter (S/cm).

4. The method of claim 3, wherein the film has the electrical conductivity in a range of $\sigma=1.5\times10^{-3}$–0.2 Siemens per centimeter (S/cm).

5. The method of claim 1, wherein the copolymer has a bandgap of no more than 2.14 electron volts (eV) and an ionization potential of no more than 4.92 eV.

6. The method of claim 1, wherein the copolymer has a bandgap of less than 2.44 eV and an ionization potential of less than 5.38 eV.

7. The method of claim 1, wherein the copolymer has a bandgap of no more than 2.29 eV and an ionization potential of no more than 5.15 eV.

8. The method of claim 1, wherein the copolymer:
    has a bandgap of 2.44 eV or less and an ionization potential of 5.38 eV or less, and
    the copolymer comprises an electron-rich heterocycle which provides the copolymer with a low ionization potential.

9. The method of claim 1, wherein the copolymer comprises cyclopentadithiophene (CPDT).

10. The method of claim 9, wherein the anionic side groups comprise sulfonate anionic side groups.

11. The method of claim 10, wherein the conjugated polyelectrolytes are PCPDTBTSO$_3$—C with a poly[2,6-(4,4-bis-Cbutanylsulfonate-4H-cyclopenta-[2,1-b;3,4-b']-dithiophene)-alt-4,7-(2,1,3-benzothiadiazole)] donor-acceptor backbone, where C is a counterion or countercation such that the doped conjugated polyelectrolyte (CPE) is soluble in water to form a pH neutral solution used during solution processing in a device.

12. The method of claim 11, wherein the counterion is at least one countercation selected from potassium K, tetrabutylammonium (TBA), and Na.

13. The method of claim 1, wherein the conjugated polyelectrolytes are PCPDTBTSO$_3$-K with a poly[2,6-(4,4-bis-potassiumbutanylsulfonate-4H-cyclopenta-[2,1-b;3,4-b']-dithiophene)-alt-4,7-(2,1,3-benzothiadiazole)] donor-acceptor backbone.

14. The method of claim 1, wherein:
    positive polarons are formed on the copolymer backbone, and
    the anionic groups increase stability of the positive polarons by coulombic stabilization.

15. The method of claim 1, further comprising fabricating the conjugated polyelectrolytes that are p-type doped in a hole transport layer in a solar cell, wherein the fabricating comprises:
- solution processing and casting a film comprising the p-type doped conjugated polyelectrolytes on a substrate;
- coating the p-type doped conjugated polyelectrolytes with a bulk heterojunction polymer active region;
- treating the active region;
- depositing a cathode on the active region;
- wherein the film has a thickness and homogenous conductivity such that the solar cell has a power conversion efficiency (PCE) of at least 6.2%, a short circuit current density $J_{sc}$ of at least 13.5 mA/cm$^{-2}$, an open circuit voltage $V_{oc}$ of no less than 0.69 V, and a Fill Factor FF of at least 0.66, under AM 1.5 G irradiation.

16. An organic optoelectronic or electronic device comprising the conjugated polyelectrolytes fabricated according to the method of claim 1, wherein the p-type doped conjugated polyelectrolytes are incorporated in a hole transport layer (HTL) or anode buffer layer in the device.

17. The device of claim 16, wherein the hole transport layer has a root mean square (RMS) surface roughness of no more than 0.74 nm over an area of at least 5 micrometers by 5 micrometers.

18. The device of claim 16, wherein, at one or more wavelengths between 450 nm and 700 nm, an incident photon conversion efficiency (IPCE) of the HTL is at least 70% and the solar cell's $J_{sc}$ is at least 16.32 mA/cm$^{-2}$.

19. An organic solar comprising the conjugated polyelectrolytes fabricated according to the method of claim 1, wherein the p-type doped conjugated polyelectrolytes are incorporated in a hole transport layer (HTL) and the solar cell has an external quantum efficiency of at least 75% at one or more wavelengths between 450 nm and 700 nm.

20. A composition of matter, comprising:
- a self-doped conjugated polyelectrolyte comprising a donor-acceptor copolymer backbone and one or more anionic side groups, wherein the donor-acceptor copolymer backbone includes cyclopentadithiophene (CPDT).

* * * * *